(12) United States Patent
Chung

(10) Patent No.: US 6,421,013 B1
(45) Date of Patent: Jul. 16, 2002

(54) TAMPER-RESISTANT WIRELESS ARTICLE INCLUDING AN ANTENNA

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/671,923

(22) Filed: Sep. 28, 2000

Related U.S. Application Data

(63) Continuation-in-part of application No. 09/411,849, filed on Oct. 4, 1999, and a continuation-in-part of application No. 09/412,058, filed on Oct. 4, 1999.
(60) Provisional application No. 60/169,790, filed on Dec. 9, 1999, provisional application No. 60/175,558, filed on Jan. 11, 2000, and provisional application No. 60/212,401, filed on Jun. 19, 2000.

(51) Int. Cl.[7] .................................................. H01Q 1/38
(52) U.S. Cl. ............................... 343/700 MS; 343/895; 235/441
(58) Field of Search .................... 343/700 MS, 895, 343/873; 257/679, 782, 777, 778; 235/441, 442; 340/572.1; 455/274; 902/26; H01Q 1/38

(56) References Cited

U.S. PATENT DOCUMENTS

| | | | |
|---|---|---|---|
| 4,417,413 A | 11/1983 | Hoppe et al. | |
| 4,483,067 A | 11/1984 | Parmentier | |
| 4,583,099 A | * 4/1986 | Reilly et al. ................. | 343/895 |
| 4,719,140 A | 1/1988 | Hara et al. | |
| 5,026,452 A | 6/1991 | Kodai | |
| 5,250,341 A | 10/1993 | Kobayashi et al. | |
| 5,404,581 A | 4/1995 | Honjo | |
| 5,430,441 A | 7/1995 | Bickley et al. | |
| 5,463,404 A | 10/1995 | Wall | |
| 5,541,399 A | 7/1996 | de Vall | |

(List continued on next page.)

OTHER PUBLICATIONS

Dr. Elke Zakel, "Smart Cards—An Overview", IEEE, — Second Workshop on Smart Card Technologies and Applications, Berlin, Nov. 16–18, 1998.

Jorge Vieira da Silva, Contact Less Smart Cards: European applications, co–operative developments and industrial supply environment, IEEE Second Workshop on Smart Card Technologies and Applications, Berlin Nov. 16–18, 1998; 18 Pages.

Peter Stampka, "Second Generation Contactless Cards, "IEEE Second Workshop on Smart Card Technologies And Applications, Berlin Nov. 16–18, 1998; 8 Pages.

E. Zakel, "Advanced Packaging For Smart Cards", IEEE Second Workshop on Smart Card Technologies And Applications, Berlin Nov. 16–18, 1998, 4 Pages.

Dymax Europe GmbH, "UV Curing Resins For Smart Cards Innovations For Smart Cards", IEEE Second Workshop on Smart Card Technologies And Applications, Berlin Nov. 16–18, 1998, 6 Pages.

(List continued on next page.)

*Primary Examiner*—Don Wong
*Assistant Examiner*—Trinh Do Dinh
(74) *Attorney, Agent, or Firm*—Dann, Dorfman, Herrell & Skillman, P.C.

(57) ABSTRACT

A wireless article, such as an identification tag or badge, includes an electronic device mounted on a substrate and connected a loop antenna for receiving and/or transmitting radio frequency signals. Electrically conductive material disposed on the substrate or in holes through the substrate of the wireless article connect the antenna terminals to the electronic device contacts. The structure and materials of the wireless article may be rugged and strong to provide a tamper-resistant article, and/or may include one or more weakened or frangible portions that easily break to provide a tamper-destruct article. The wireless article may be arranged to resist heat, moisture and/or solvents, to function in severe environments such as laundering and industrial processes.

57 Claims, 6 Drawing Sheets

U.S. PATENT DOCUMENTS

| | | | |
|---|---|---|---|
| 5,574,470 A | | 11/1996 | de Vall |
| 5,598,032 A | | 1/1997 | Fidalgo |
| 5,690,773 A | | 11/1997 | Fidalgo et al. |
| 5,751,256 A | | 5/1998 | McDonough et al. |
| 5,847,931 A | | 12/1998 | Gaumet et al. |
| 5,880,934 A | | 3/1999 | Haghiri-Tehrani |
| 5,892,661 A | | 4/1999 | Stafford et al. |
| 5,903,239 A | | 5/1999 | Takahashi et al. |
| 5,909,050 A | | 6/1999 | Furey et al. |
| 5,936,305 A | | 8/1999 | Akram |
| 5,994,166 A | * | 11/1999 | Akram et al. ............... 438/108 |
| 6,018,299 A | | 1/2000 | Eberhardt |
| 6,049,461 A | | 4/2000 | Haghiri-Tehrani et al. |
| 6,088,901 A | * | 7/2000 | Huber et al. ............... 29/469.5 |
| 6,100,804 A | * | 8/2000 | Brady et al. ............. 340/572.7 |
| 6,161,761 A | | 12/2000 | Ghaem et al. |
| 6,181,278 B1 | * | 1/2001 | Kakimoto et al. ... 343/700 MS |
| 6,219,238 B1 | * | 4/2001 | Andros et al. .............. 361/704 |
| 6,232,667 B1 | * | 5/2001 | Hultmark et al. ........... 257/777 |

OTHER PUBLICATIONS

K. Haberger et al. Comparison Of Different Methods To Make Extremely Thin IC's, IEEE Second Workshop on Smart Card Technologies And Applications, Berlin Nov. 16–18, 1998, 6 pages.

Reinhard Jurisch, "Coil On Chip Technology For Closed Coupling Contactless Chip Cards", Microsensys, IEEE Second Workshop on Smart Card Technologies and Applications '98, 5 Pages.

Kevin Chung, Ph.D., "Smart Card Die–Attach And Module Lamination Alternatives", IEEE Second Workshop on Smart Card Technologies And Applications, Berlin, Nov. 16–18, 1998, 9 Pages.

"Dupont Photopolymer & Electronic Materials", IEEE Second Workshop on Smart Card Technologies And Applications, Berlin Nov. 16–18, 1998, 17 Pages.

Gunter Schiebel, "Low Cost Smart Card/RFID Assembly Using Flip Chip Shooters", Siemens AG, IEEE Second Workshop on Smart Card Technologies And Applications, Berlin Nov. 16–18, 1998, 12 Pages.

* cited by examiner

TAMPER-RESISTANT WIRELESS ARTICLE INCLUDING AN ANTENNA

This Application claims the benefit of U.S. Provisional Application Ser. No. 60/169,790 filed Dec. 9, 1999, of U.S. Provisional Application Ser. No. 60/175,558 filed Jan. 11, 2000, and of U.S. Provisional Application Ser. No. 60/212,401 filed Jun. 19, 2000, and is a continuation-in-part of U.S. patent application Nos. 09/411,849 and 09/412,058, both filed Oct. 4, 1999.

The present invention relates to a wireless article and, in particular, to a wireless article including an antenna.

Wireless articles, such as tags, identification badges, smart cards and the like, are in wireless communication with a base unit or reader via a radio-frequency (RF) communication link. RF transmissions transmitted by the base unit may be received by an antenna on the wireless article or RF transmissions transmitted by the wireless article by an antenna thereon may be received by the base unit. Or RF transmissions by each of the wireless article and the base unit may be received by the other one thereof.

In each case, the RF signals either received or transmitted by the wireless article are received or transmitted by an antenna thereon. Because wireless articles are usually desired to be small in size, the antenna thereon must also be small in size. For a loop-type antenna, the sensitivity of the antenna to small amplitude RF signals and the amplitude of the RF signals transmitted by the antenna are a direct function of the area enclosed by the antenna loop and the number of turns of the conductor forming the loop. For a small tag or badge, the size thereof limits the area that an antenna loop can enclose, thereby limiting the RF performance of the antenna. Typically, RF identification tags operate in the frequency range of 100 KHz to 3 GHz, or higher.

Wireless articles, such as RF tags, are often used for purposes of security or other purposes where it is desirable that a rugged wireless article be permanently attached to an object and that any attempt to remove, alter or otherwise tamper with the wireless article, or attach the wireless article to a substitute object, be evident. The need for such security is particularly acute when the value of the objects to be controlled or inventoried is high. Conventional RF tags have been ruggedized and/or fortified so as to be physically resistant to tampering or to survive in hostile environments, such as laundering or industrial processing, or in repeated usage, however, the conventional approach has typically been to add physical reinforcement, thereby adding further undesirable complexity and cost to the conventional tag.

Accordingly, there is a need for a wireless article having a structure that readily evidences and/or resists tampering and yet is relatively simple and relatively inexpensive to make.

To this end, the tamper-resistant article of the present invention comprises a substrate including at least one layer of a strong dielectric adhesive having an exposed surface adapted for attaching said substrate to an object. A pattern of electrically-conductive material including an elongated electrical conductor is on one surface of the substrate and has at least one electrical contact. At least one electronic device is attached to the substrate by a strong adhesive and has at least one contact electrically connected to the contact of the pattern of electrically-conductive adhesive, whereby at least one of the strong dielectric adhesive of the substrate and the strong adhesive attaching the electronic device render the article resistant to tampering.

According to another aspect of the invention, a tamper-destruct article comprises a substrate including at least one layer of a dielectric adhesive having an exposed surface adapted for attaching the substrate to an object. A pattern of electrically-conductive material including an elongated electrical conductor is on one surface of the substrate and has at least one electrical contact. At least one electronic device is attached to the substrate by an adhesive and has at least one contact electrically connected to the contact of the pattern of electrically-conductive adhesive, wherein at least one of the pattern of electrically conductive material and the electrical connection of the contact of the electronic device to the substrate includes at least one frangible region.

BRIEF DESCRIPTION OF THE DRAWING

The detailed description of the preferred embodiments of the present invention will be more easily and better understood when read in conjunction with the FIGURES of the Drawing which include.

Figure 1:
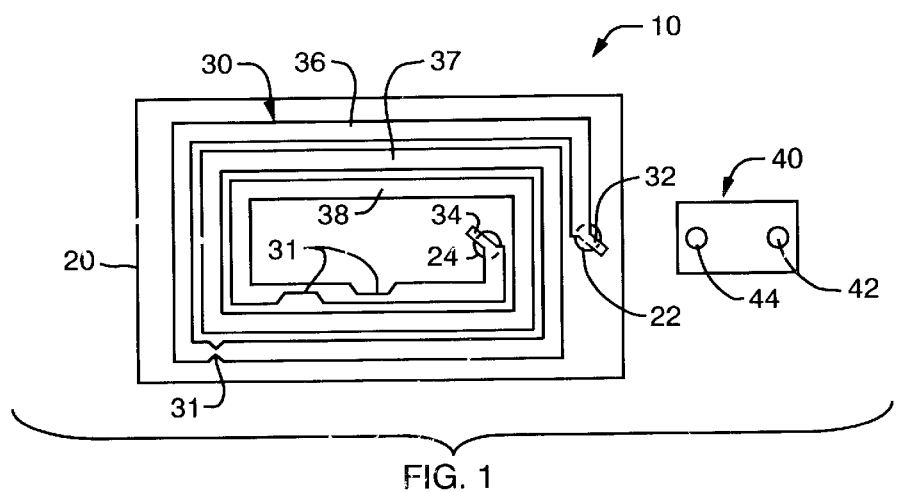
FIG. 1 is a plan view schematic diagram of one surface of an exemplary embodiment of a substrate useful in an article according to the present invention.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification, but in the Drawing are preceded by digits unique to the embodiment described. For example, a particular element may be designated as "xx" in one figure, by "1xx" in another figure, by "2xx" in another figure, and so on. As is typical, the figures are not to scale and may be partially enlarged or reduced for purposes of illustration.

DESCRIPTION OF THE PREFERRED EMBODIMENT

The articles described herein, in particular, wireless articles having electronic circuitry for communicating with an external device such as a reader or interrogator, are desired to be resistant to tampering and attempts to tamper with the article and/or the electronic circuitry thereof. Such articles may be described as being "tamper-destruct" and/or "tamper-resistant" articles. A "tamper-destruct" article becomes disabled, non-functional and/or inoperative if one attempts to tamper with or change the article. Typically, tamper destruct properties are provided by one or more elements of the wireless article being made so as to be frangible and tend to break easily if one attempts to alter the wireless article, to remove it from the object to which it is attached or is otherwise tampers with the article. Typically, a thin or narrow portion, e.g., less than about 25 μm (about 1 mil) in either thickness or width or both, or a relatively-weak bonding, may be provided so as to be fragile and not withstand an attempt to remove the article from the object to which it is attached, thereby providing a tamper-destruct property. Wireless articles may also be "tamper-resistant" in that they are physically strong so as to be capable to withstand severe physical handling and/or environments, and/or so as to not be removable from an object to which they are attached without physically damaging or destroying the wireless article and/or the object. As a result, tampering with a tamper-destruct or a tamper-resistant article produces evidence thereof that is apparent to an observer. Tamper resistant articles are typically also tamper destruct articles, but need not be.

Advantageously, the tamper resistant and/or tamper destruct properties are provided by the structure of the wireless article according to the invention, and the elements thereof, without the addition of special structure or extra processing steps which would undesirably increase the complexity and/or the cost of the article. Further, the structure and materials providing a frangible tamper resistant feature may also be utilized to produce a wireless article that is capable of withstanding exposure to harsh environments, such as those encountered in laundry and cleaning processes as well as in industrial processes.

In FIG. 1, substrate 20 for a wireless article 10 is a generally planar sheet of an insulating material. A loop antenna 30 is formed of an elongated conductor having a plurality of loops or turns 36, 37, 38 generally in a spiral pattern on one surface of substrate 20. The ends 32, 34 of loop antenna 30 located at the respective ends of outermost loop or turn 36 and innermost loop or turn 38, respectively, define antenna terminals 32, 34. Illustrated along surface substrate 20, an electronic device 40, such as a semiconductor integrated circuit, a hybrid circuit or other suitable electronic device, has two spaced-apart contacts 42, 44.

Usually, the spacing between the two contacts 42, 44 of electronic device 40 are a given dimension that is determined by the supplier of the electronic device 40 and so is not easily changed. As a result, the spacing between contacts 42, 44 of electronic device 40 defines the spacing of the contacts on substrate 20 to which electronic device 40 connects, i.e. the desired spacing between holes 22, 24 of substrate 20. Regarding the exemplary substrate 20 of FIG. 1, the width of and the number of turns of loop antenna 30 are sufficiently large so that electronic device 40 cannot be attached to substrate 20 on the same surface as loop antenna 30 because of the likelihood of an electrical short circuit being formed. Such short may occur between adjacent loops, such as loops 36–37 or loops 37–38 of loop antenna 30 by the spreading or flowing of the electrically-conductive material which would be utilized to make electrical connection between antenna terminals 32, 34 and electronic device contacts 42, 44 when electronic device 40 is attached to the same surface of substrate 20 as is antenna 30. Additionally, other parts of electronic device 40 could come into unwanted electrical connection or coupling to one or more of the turns 36, 37, 38, for example, one or more of the intermediate turns 37, of antenna 30.

To avoid the possibility of such unwanted short circuits, substrate 20 has two vias or holes 32, 34 spaced apart a distance corresponding substantially to the spacing between antenna terminals 32, 34. Loop antenna 30 and substrate 20 are positioned so that the two terminals 32, 34 of loop antenna 30 overlie the two vias or holes 22, 24 through substrate 20, whereby electrical contact may be made with antenna terminals 32, 34 from the other surface of substrate 20 through holes 22, 24, respectively. It is noted that antenna 30 is preferably, but need not be, a generally spiral conductor pattern located close to the edges of substrate 20 so as to increase the area encompassed thereby, and may be of a circular spiral, oval or elliptical spiral, square or rectangular spiral, or other convenient pattern, including a free-form shape.

To provide tamper-destruct features for substrate 20, loop antenna 30 may include one or more "weakened" portions at which it is easily broken or fractured if substrate 20 is tampered with. Such weakened portions may take the form of notches 31 provided by notching one or both edges of the conductor loops 36, 37, 38 or the thickness thereof. Notches 31 may include, for example, one or more directly opposing "V"-shaped notches, offset opposing "V"-shaped notches or a single "V"-shaped notch, or may include one or more narrowed lengths of conductor 36, 37, and/or 38, whether directly opposing or offset, as is desired. Alternatively or additionally, antenna 30 may be weakened by employing a very thin layer of metal foil or deposited metal to form antenna 30. Typically, the thicknesses of such thin metal materials is less than 25 μm (about 1 mil), and may preferably be in the range of about 2.5 to 12.5 μm (about 0.1 to 0.5 mils). Thus, antenna 30 is frangible and tends to break easily if article 10 is attempted to be removed from the object to which it is attached or is otherwise tampered with.

Figure 2:
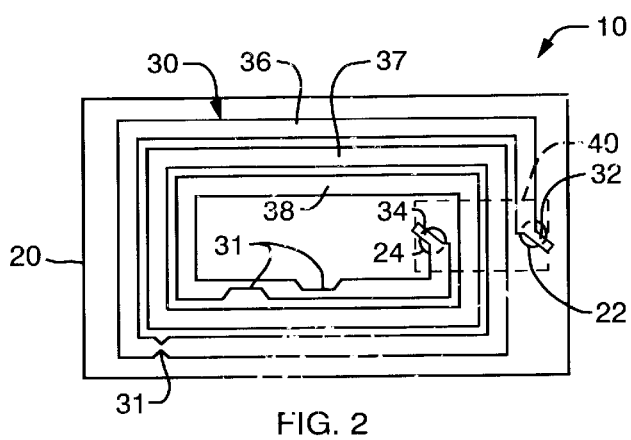
FIG. 2 is a plan view of the article of FIG. 1 with an electronic device attached thereto.
Figure 3A:
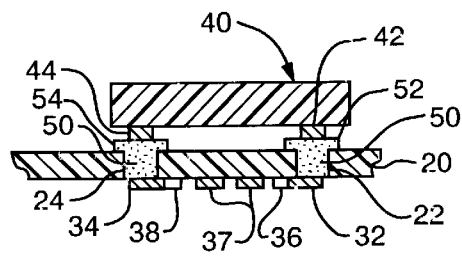
FIGS. 3A and 3B are side cross-sectional view schematic diagrams of part of the article of FIG. 2 showing the connection of the electronic device thereto.

To assemble wireless article 10 of FIG. 2, antenna 30 is formed on or attached to a first surface of substrate 20, the holes 22, 24 of substrate 20 are filled with an electrically-conductive material that will form the electrical connections between antenna terminals 32, 34 and device contacts 42, 44, respectively, and the electronic device 40 (shown in phantom) is attached to the opposing surface of substrate 20. The resulting wireless article 10, a portion of which is shown in cross-section in FIG. 3A, includes substrate 20 having holes 22, 24 therein filled with electrically-conductive material 50 which extends therefrom to form conductive features or "bumps" 52, 54. Conductive material 50 also provides electrical connection to terminals 32, 34 of antenna 30. Contacts 42, 44 of electronic device 40 connect to conductive bumps 52, 54 and may be pressed into place when the material of bumps 52, 54 is an electrically-conductive adhesive. Connection of contacts 42, 44 to bumps 52, 54 of electrically-conductive adhesive may be made by pressing electronic device 40 in place against substrate 20 when electrically-conductive adhesive of bumps 52, 54 is wet or may be made by so pressing device 40 into place with appropriate heating to provide melt flow bonding after adhesive bumps 52, 54 are dried or B-staged. Alternatively, electronic device 40 may be mounted on the same surface of substrate 20 as is antenna 30 with contacts 42, 44 directly connected to antenna terminals 32, 34, respectively, in which case, holes 52, 54 are unnecessary.

Figure 3B:
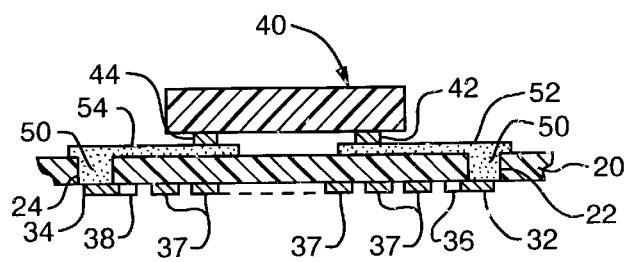

The embodiment of FIGS. 1 and 2 is particularly advantageous where the number of turns of antenna 30 is sufficiently large that the distance between antenna contacts 32 and 34 is greater than the distance between contacts 42, 44 of electronic device 40. As shown in the exemplary embodiment of FIG. 3B, for example, conductive material 50 is deposited to fill holes 22, 24 and to form conductive strips (i.e. conductors) 52, 54 extending from the electrically-conductive material 50 in widely spaced holes 22, 24 to locations spaced apart the same distance as are contacts 42, 44 of electronic device 40. Contacts 42, 44 of electronic device 40 then connect to the ends of conductive strips 52, 54 and may be pressed into place when the material of bumps 52, 54 is an electrically-conductive adhesive. Connection of contacts 42, 44 to conductors 52, 54 of electrically-conductive adhesive may be made by pressing electronic device 40 in place against substrate 20 when the electrically-conductive adhesive of conductive strips 52, 54 is wet or may be made by so pressing device 40 into place with appropriate heating to provide melt flow bonding after adhesive strips 52, 54 are dried or B-staged.

It is noted that the portion of conductors 50 filling holes 22, 24 may be formed of a variety of materials, such as by building up metal, such as by plating copper, beryllium copper, brass and other copper alloys, or nickel or aluminum or other suitable metal, to fill holes 22, 24, or may be made by depositing electrically-conductive adhesive to fill holes 22, 24, such as by screen printing, stenciling and the like. It is further noted that one or more additional deposits of electrically-conductive adhesive onto substrate 20 may be utilized if it is desired to increase the height of conductors and/or bumps 52 from what is obtained with a single deposition of adhesive. Further, electrically-conductive adhesive bumps may be deposited on the contacts 42, 44 of electronic device 40 with like result. In addition, a layer of metal, such as nickel, gold, nickel-gold and the like may be deposited, such as by plating, onto conductors 50, 52, 54 formed of electrically-conductive adhesive. This plated metal layer, in addition to serving to resist oxidation of the conductors, increases the height thereof and/or otherwise facilitates connection of the contacts of electronic devices 40 to the plated contacts 50, 52, 54 with solder, e.g., with solder bumps as in the mounting of conventional flip-chip components.

This embodiment is substantially different from conventional plated-through holes as in conventional printed circuit wiring boards, whether of single layer or multi-layer type, and whether of rigid or flexible type, wherein plating is deposited on the interior surface of the holes to make electrical contact with the thin edges of metal conductors that are on various ones of the surfaces and layers thereof. Here, on the other hand, conductive material is built up to fill the hole and contacts the broad surface of the conductors on the surface of the substrate, either through physical contact or by being part thereof as in the case of deposited conductive adhesive.

Wireless article 10 is fabricated as follows. A substrate 20, preferably of sheet poly-vinyl-chloride (PVC), polyimide, poly-ethylene terephthallate (PET), acrynitrile-butadiene-styrene (ABS), polybutylene terephthallate, or polyester such as polyester terephthallate, polymer blends, paper film, dried or B-staged insulating adhesive or other suitable substrate material, is provided, and holes 22, 24 are made therein, such as by die cutting, punching, drilling, mechanical drilling, laser drilling or cutting, photoresist and etching, or other suitable method. The sheet is typically about 0.75 mm thick (about 0.03 inch thick), but may range between 0.05 and 1.0 mm thick (about 0.002 to 0.040 inch thick, i.e. 2–40 mils). Preferably, a sheet of the substrate material that is large enough to be cut into a plurality of substrates is provided, such as a 280 mm by 280 mm (about 11 inch by 11 inch) sheet on which a 3 by 4 array of 12 substrates, each about 83.5 mm by 132.9 mm (about 2.125 inch by 3.375 inch), may be formed. Preferably, the sheet is processed to contemporaneously form an array of wireless articles 10 thereon before it is excised or cut to separate the individual wireless articles 10.

Alternatively, substrate 20 can be formed by screen printing or stencil printing a dielectric adhesive layer having holes 22, 24 therein defined by the pattern of the screen or stencil utilized. This method is preferred where the loops 36, 37, 38 of antenna 30 are photo-etched from a sheet of metal foil laminated to such dielectric adhesive layer substrate 20, such as by photo-etching as utilized in the making of conventional printed wiring circuit boards.

A stencil, screen or mask defining the pattern of an array of antenna 30 corresponding to the array of substrates is positioned with the sheet of substrate material and an electrically conductive adhesive 50 is deposited on a first surface thereof in the pattern of the array of antenna 30. Typically, the substrate 20 is between about 0.25 mm and 1 mm thick (about 10–40 mils thick), and the conductors 36, 37, 38 forming antenna 30 are about 250 $\mu$m (about 10 mils) wide and are within the range of about 25 $\mu$m to 125 $\mu$m thick (about 1.0 to 5 mils thick). In most cases, conductors 36, 37, 38 of antenna 30 are about 50–100 $\mu$m thick (about 2–4 mils thick) when wet and about 25–75 $\mu$m thick (about 1–3 mils thick) after drying or B-staging. The conductive adhesive 50 may completely or partially fill holes 22, 24 in substrates 20. Where holes 22, 24 are larger than about 0.1 mm (about 4 mils) diameter, it is relatively easy to pass sufficient conductive adhesive 50 through the corresponding holes in the stencil, screen or mask to fill holes 22, 24 of substrate 20. Suitable conductive adhesives 50 include, for example, type PSS8150 thermosetting conductive adhesive and type ESS8450 flexible conductive adhesive, both of which are filled with silver particles and are available from AI Technology, Inc. located in Princeton, N.J. The deposited conductive adhesive 50 is dried or B-staged by heating in an oven to about 60° C. for about 60 minutes.

A second deposit of the same conductive adhesive 50 is made in like manner on the opposing surface of the sheet of substrate material. A stencil, screen or mask defining the pattern of contact sets corresponding to the contacts 42, 44 of electronic device 40 and holes 22, 24 for the array of substrates is positioned with the sheet of substrate material and the electrically conductive adhesive 50 is deposited on the opposing surface thereof in the pattern of the array of contacts 42, 44. The electrically conductive adhesive 50 deposited on this second surface of the array of substrates flows into holes 22, 24 to contact the like adhesive deposited of the first surface thereof to form antenna 30 and to form contacts 52, 54 to which contacts 42, 44 of electronic device 40 connect. The materials, application and processing of conductive adhesive 50 is like that utilized with respect to the first surface of the sheet of substrates.

Electronic devices 40 may be positioned to the sheet of substrates either when the adhesive 50 is still wet from being deposited or after adhesive 50 is dried or B-staged. Preferably, electronic devices 40 are flip-chip semiconductor devices with plated or otherwise oxidation resistant contacts 42, 44 that are positioned onto substrates 20 by conventional pick-and-place or flip-chip assembly equipment. Where electronic devices 40 are placed when conductive adhesive 50 is still wet, the sheet of substrates 20 with electronic devices 40 attached thereon is cured to form a sheet of wireless articles 10 which is then excised or cut apart, as by die cutting, laser cutting or the like, into the individual wireless articles 10. Curing of type ESS8450 thermosetting adhesive is performed by heating the wireless article in an oven to a temperature above 100° C. for about 30 minutes or more. For thermoplastic adhesives such as type PSS8150, attachment may be completed by drying out the solvent from the adhesive, e.g., by heating to about 60° C. for about 60 minutes.

Where electronic device 40 bridges one or more turns 37 of antenna 30 or other conductors formed of electrically-conductive adhesive, and particularly where the width or spacing of such conductors is small, i.e. less than about 0.25–0.5 mm (about 10–20 mils), the deposited conductive adhesive is preferably dried or B-staged before attachment of electronic device 40. A second deposition of the same electrically-conductive adhesive is made to deposit a second layer of adhesive on bumps 52, 54 to which electronic device 40 may be attached while the second layer of adhesive is wet or after drying or B-staging. However, where the conductor width or spacing is small, it is preferred that attachment of electronic device 40 be after the second deposition of conductive adhesive on bumps 52, 54 has been dried or B-staged.

Optionally, but in many applications, preferably, an insulating adhesive underfill in liquid form may be applied along the edges of electronic device 40 from where it flows by capillary action to substantially fill the remaining volume between electronic device 40 and substrate 20 that is not filled by conductive adhesive 50. Such adhesive underfill provides additional mechanical strength to the attachment of electronic device 40 to substrate 20 and resistance to moisture and other potential contaminants. Where the electrically-conductive adhesive 50 is a flexible adhesive such as type PSS8150, as is desirable where the substrate 20 is somewhat flexible, a flexible adhesive underfill, such as types MEE7650 and MEE7650-5 flexible epoxy adhesive or type MEE7660 high-strength epoxy adhesive, also available from AI Technology, is preferably utilized. Alternatively to underfill of electronic device 40, a spot or drop of adhesive may be deposited onto substrate 20 in an area to be covered by electronic device 40, but not including any electrical contacts of substrate 20 or device 40, for mechanical attachment between substrate 20 and device 40. If electronic device 40 has an insulating, e.g., passivated, top surface, then the drop of adhesive could be either electrically conductive or insulating, as desired, however, if electrical contact to that surface of device 40 would adversely affect its operation or performance then insulating adhesive should be employed.

Also optionally, a protective coating may be applied to wireless article 10 to protect against mechanical damage and environmental conditions, such as moisture, water, solvents, dirt and other materials. One suitable protective coating material is the type MEE7650 flexible insulating adhesive that is also used for underfill of electronic device 40. In such case, the application of the underfill adhesive and of the overcoat adhesive may be accomplished in one operation. For example, where the over coating material is applied in liquid form as by spraying or dipping, the insulating adhesive will flow under electronic device 40 to form the underfill adhesive thereunder contemporaneously with it forming the protective coating. The protective coating may also be sheets of dried or B-staged insulating adhesive laminated to one or both surfaces of wireless article 10. Where type ESP7450 flexible adhesive is laminated on substrate 20 to cover electronic device 40, underfill is not required between device 40 and substrate 20.

Flexibility of a material is related to the degree of elongation that a material exhibits before it fails. In general, flexible materials have a modulus of elasticity that is less than about 35,000 kg/m$^2$ (about 500,000 psi) and are capable of >30% elongation without failure. Where substrate 20 has a given degree of flexibility, it is preferred that the flexible conductive adhesive material that forms conductors 30, 50 and adhesive layer 58 thereon, for example, be at least as flexible as is substrate 20, i.e. exhibit at least the same or a greater percentage elongation prior to failure.

In an alternative embodiment of the making of wireless article 10, a dielectric layer is deposited on a sheet of release liner material to serve as substrate 20, such as by roll coating, screening stenciling, or other suitable method. Where dielectric layer 20 is formed by screening, stenciling, or other printing method, it is formed with holes 22, 24 therein for conductive adhesive 50. Otherwise, holes 22, 24 are formed in dielectric layer 20 after it is dried or B-staged, such as by die cutting, laser drilling or other suitable method. After dielectric layer 20 is dried or B-staged, antenna 30 and conductive adhesive 50 are applied, electronic device 40 is attached and protective coating layers, if any, are applied, all as described above. Alternatively, The pattern of loop antenna 30 may be formed of conductive adhesive deposited on a sheet of release liner with conductive adhesive bumps 52, 54 formed thereon at the terminals of antenna 30. The deposited conductive adhesive is then dried or B-staged. Then dielectric layer 20 is applied directly over deposited antenna 30 and bumps 52, 54 to a thickness less than or equal to the height of bumps 52, 54, resulting in substrate 20 with antenna 30 and conductive bumps 52, 54 therein, ready for attachment of electronic device 40 thereto. Preferably, an array of wireless articles 10 are made contemporaneously by depositing an array of antennae 30, an array of substrates 20 in one layer, an array of conductive bumps 52, 54, and so forth, resulting in a panel of an array of wireless articles 10 that are then excised, such as by die cutting, rotary cutting, or other suitable method, into individual articles 10.

An alternative embodiment of wireless article 10 employs a metal foil loop antenna 30. A sheet of metal foil, such as a copper foil, an aluminum foil or a silver foil, is provided, typically between about 0.013 mm and 0.10 mm thick (about 0.5 to 4 mils thick). A layer of dielectric material 20 is applied thereto, such as by roll coating, screening or stenciling an insulating adhesive thereon, including holes formed at the locations at which antenna terminals 32, 24 are to be formed in the metal foil. The dielectric layer is preferably formed of an insulating adhesive, such as type ESP7450 thermosetting epoxy adhesive, type MB7100 thermoplastic adhesive or type CB7200-E thermosetting adhesive, each available from AI Technology, Inc. located in Princeton, N.J. Typically, substrate 20 has a dry thickness between about 0.05 mm and 0.5 mm (about 2–20 mils) when employed in an article compliant with an international standard for cards and tags with embedded integrated circuits, but may have a dry thickness between about 0.25 mm and 1 mm (about 10–40 mils) for other uses, and is B-staged and/or cured prior to photo-etching of antenna 30 described below. Conductive adhesive 50 is deposited to fill holes 22, 24 in substrate 20 and to provide contacts 52, 54 to which electronic device is to attach, as above, and is also cured prior to photo-etching of antenna 30.

Antenna 30 is made by photo-etching, i.e. by depositing a photoresist material to the exposed surface of the metal foil, exposing and developing the photoresist material to define the pattern of antenna 30 and then etching away the unwanted metal foil material to leave antenna 30 on substrate 20, in like manner to the etching of conventional printed wiring circuit boards, for example. Suitable photoresist and photo-etching materials are widely available in liquid, paste and film form, such as from MacDermid Company located in Connecticut and from E.I duPont de Nemoirs & Company located in Delaware. Suitable insulating adhesives, such as AI Technology type ESP7450, when cured, withstand exposure to the chemicals and environments employed in the photo-etching processes. Preferably, an array of wireless articles 10 are made contemporaneously by depositing an array of substrates 20 in one layer, depositing an array of conductive bumps 52, 54, and etching an array of metal foil antennae 30, and so forth, resulting in a panel of an array of wireless articles 10 that are then excised into individual articles 10.

Alternatively, instead of depositing conductive adhesive 50 into holes 22, 24 in the insulating adhesive substrate 20, a photoresist pattern may be employed to define locations for depositing conductive metal onto antenna 30, either before or after the metal foil is etched to form antenna 30. In particular, conductive metal is deposited onto antenna 30 not only on the exposed surface thereof adjacent the surface of substrate 20, but also onto antenna terminals 32, 34 accessible via holes 22, 24 to plate or otherwise build up a metal conductor to fill holes 22, 24 in substrate 20. If the plating material is copper or other material susceptible to oxidation or other degradation of conduction and adhesion properties, then a metallization or moisture resistant layer or layers of a non-oxidizing or precious metal, such as tin, nickel, silver, gold, palladium, platinum, nickel-gold, or nickel-palladium, or the like, should be applied over the built-up via conductors in holes 22, 24. The building up of such via conductors, which may be performed either before or after the metal layer is photo-etched to form the pattern of antenna 30, as is the plating thereof to facilitate solder bump attachment of the contacts of an electronic device thereto, is further described in U.S. patent application Ser. No. 09/412,052 (AI-TECH-13) entitled "Contact Module, As For a Smart Card, And Method For Making Same" filed by Kevin Kwong-Tai Chung on Oct. 4, 1999, and which is hereby incorporated herein by reference in its entirety. Conductive adhesive contacts 52, 54 are thereafter deposited onto the filled via holes 52, 54 for connecting to contacts 42, 44 of electronic device 40 and attaching same to substrate 20. Conductive adhesive types PSS8090, CB8130, PSS8150, ESS8450, ME8456, ME8550-SMT or ME8650 and underfill insulating adhesive type MEE7650 or type MEE7660, all available from AI Technology, are preferred in this embodiment.

Where electronic device 40 is on the surface of substrate 20 opposite to antenna 30, it is preferred to have the portion of the metal antenna 30 near holes 22, 24 to overlie holes 22, 24, i.e. that the metal trace be left completely or substantially intact, to ease or facilitate making of electrical connection thereto, either directly or through holes 22, 24. Similarly, where antenna 30 is deposited of conductive adhesive, it is preferred to deposit the conductive adhesive to cover holes 22, 24 for the same reason.

Figure 4:
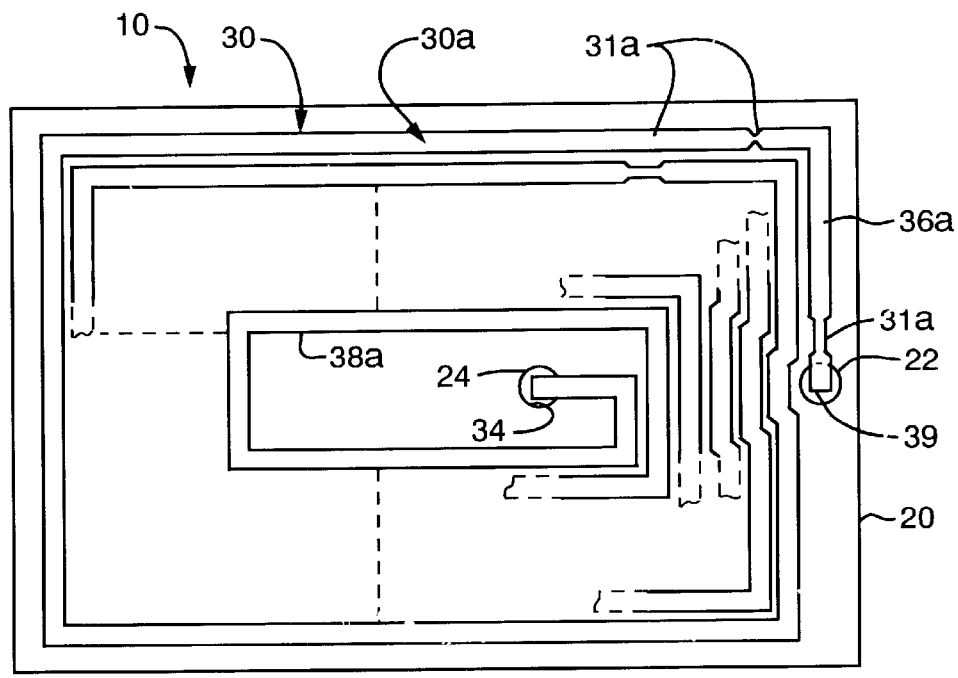
FIGS. 4 and 5 are plan view schematic diagrams of respective opposing surfaces of an exemplary embodiment of a substrate useful in an article according to the present invention.
Figure 5:
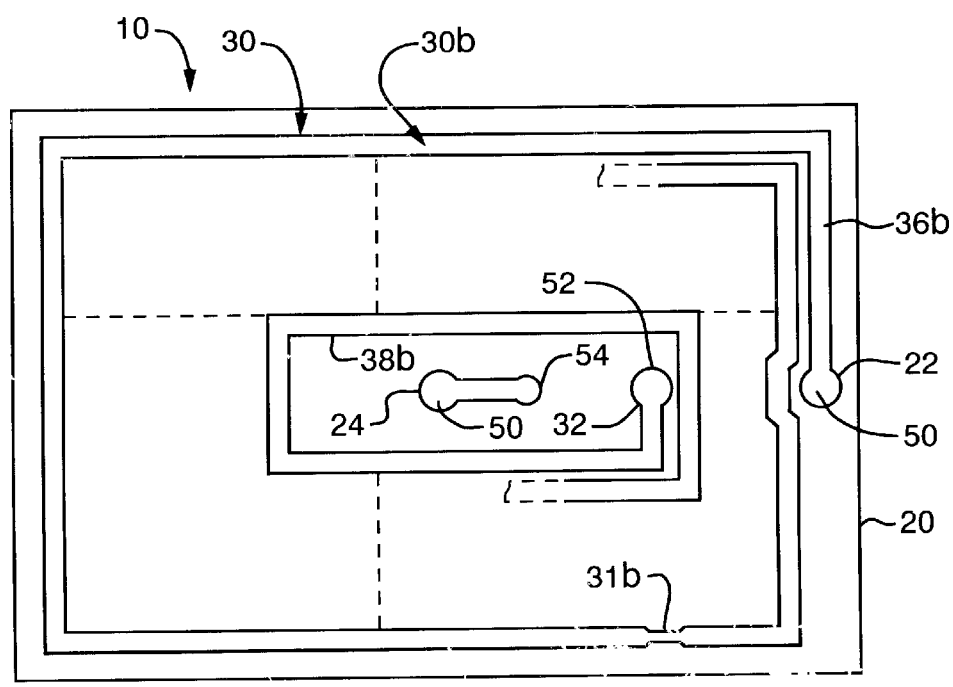

The present invention is also advantageous for wireless articles having antennas with a greater number of turns than can or might be desired to be formed on one surface of a substrate. FIGS. 4 and 5 are plan views of opposing surfaces of an exemplary embodiment of a substrate of an article having such greater number of turns. Antenna 30 thereof comprises antenna portion 30A on the one surface of substrate 20 in series with antenna portion 30B on the other surface thereof. Antenna portion 30A includes outermost turn 36A, innermost turn 38A, and intermediate turns 37A therebetween, and may be formed of a pattern of a thin metal foil as shown or of a pattern of deposited conductive adhesive, as described above in relation to FIGS. 1–3. The ends 34, 39 of antenna portion 30A are positioned over holes 24, 22, respectively, in substrate 20, and end 34 serves as one terminal of antenna 30.

Antenna portion 30B includes outermost turn 36B, innermost turn 38B, and intermediate turns 37B therebetween, and is formed of a pattern of conductive adhesive deposited onto substrate 20, as described above in relation to FIGS. 1–3. The depositing of conductive adhesive to form antenna portion 30B preferably also provides conductive material 50 substantially filling holes 22, 24 through substrate 20, although the filling of holes 22, 24 may be accomplished in a separate deposition. As most easily seen in FIG. 5 in conjunction with the sectional view of FIG. 6, terminal 34 of antenna 30 is connected to conductive contact 54 by conductive material 50 filling hole 24 through and deposited on substrate 20. Similarly, end 39 of outermost turn 36A of antenna portion 30A is connected to the end of outermost turn 36B of antenna portion 30B by conductive material 50 filling hole 22 in substrate 20. The other end 34 of deposited antenna portion 30B serves as the second terminal 32 of antenna 30 at which is formed conductive adhesive contact 52. Conductive adhesive contacts 52, 54, which are spaced apart an appropriate distance for receiving the contacts 42, 44, respectively, of electronic device 40 for electrically connecting antenna 30 to electronic device 40, are formed by the deposition forming antenna portion 30A and may be augmented in height by one or more additional depositions of conductive adhesive, as described above. It is noted that each of antenna portions 30A, 30B of antenna 30 is preferably, but need not be, a generally spiral conductor pattern located close to the edges of substrate 20 so as to increase the area encompassed thereby, and may be of a circular spiral, oval or elliptical spiral, square or rectangular spiral, or other convenient pattern, including a free-form shape.

In order to increase the number of turns of antenna portions 30A, 30B, the conductors can be narrowed where they are close to features, such as is shown in FIGS. 4 and 5 where turns 37A and 37B pass near hole 22, that restrict the space available for such conductors to pass through. These narrowed portions may provide the weakened easily-breakable portions 31 of antenna 30 that provide tamper destruct properties or additional weakened portions 31A, 31B may be included in antenna portion 30A and 30B, respectively. The conductors of loops 36A, 36B, 37A and/or 37B, for example may be reduced from the typical width of about 0.5–2 mm (about 20–40 mils) to about 0.125 mm (about 5 mil) conductors at a spacing of about 0.25 mm (about 10 mils). This is particularly helpful where the conductors 37B pass underneath electronic device 40 and the number of conductors, i.e. the number of turns of antenna 30, is restricted by the distance between contacts 42, 44 of electronic device 40. Where the width of conductors 37 or contacts 52, 54 are too small for deposition by conventional screen printing, the larger dimension features, such as the full width portions of conductors 37A, 37B, may be deposited by mesh screen printing and the finer features, such as the narrowed portions of conductors 37A, may be deposited by stenciling, with sufficient overlap to provide reliable electrical connection.

For example, consider the dimensions (approximate) to pass eight conductors 37 of the dimensions given ( which may be reduced dimensioned of narrowed conductors) under a device 40 which has its contacts 42, 44 located close to diagonally opposite corners:

| Conductor 37 Width | Conductor 37 Pitch | Spacing of Device 40 Contacts 42, 44 | Device 40 Edge Dimension |
|---|---|---|---|
| 100 µm (4 mils) | 200 µm (8 mils) | 1.3 mm (50 mils) | 1 mm (40 mils) |
| 125 µm (5 mils) | 200 µm (10 mils) | 1.63 mm (65 mils) | 1.3 mm (50 mils) |
| 150 µm (6 mils) | 200 µm (12 mils) | 2 mm (80 mils) | 1.3 mm (50 mils) |

Antenna portions 30A, 30B, conductive material 50 and conductive strips 52, 54 may be deposited of any suitable electrically-conductive adhesive, such as type PSS8150 flexible electrically-conductive thermoplastic adhesive, or type CB8130, PS8090, ME8456, ME8550-SMT or ME8650, all available from AI Technology, which may serve as conductors 32, 36, 37, 38, 39, 50, 52, 54 as well as the contacts 52, 54 adhesive that attaches and electrically connects electronic device 40 to substrate 20. As previously described, it is preferred that the contacts of an etched or otherwise patterned metal loop 30A be coated or plated with a precious or other suitable metal to preserve the conductive and adhesion properties thereof. in addition, a suitable dielectric underfill may be employed to strengthen the attachment of electronic device 40 to substrate 20 as described above.

Articles having conductors, including articles having a plural-turn loop antenna, on both surfaces of a substrate may be formed by at least the two following methods. A substrate is provided of a conventional high-strength thermoplastic film material, such as an acrynitrile-butadiene-styrene (ABS), polyester, polyimide, polyphynylene sulfide, polysulfone, polyether sulfone, or other high-temperature resin or other suitable material. Usually, processing a sheet of substrate material of size sufficient to form an array of substrates 20 is preferred over processing substrates 20 individually, but either is acceptable. An about 25 mm by 50 mm (about 10 inch by 20 inch) or larger sheet is convenient for screen printing deposition of adhesive and is conveniently diced or cut into individual substrates, such as by rotary dicing. A pattern of holes or vias 22, 24 are cut in the substrates 20 and may be of sufficient size, e.g., about 1 mm (about 40 mils) or larger (which is comparable to the 1 mm width commonly utilized for antenna 30 conductors), as can be readily cut or punched out with suitable conventional tools, such as punches, drills and dies. Commonly available electrically-conductive inks and adhesives may then be deposited, such as by screen printing or stenciling, onto both surfaces of the sheet of substrates 20 to cover and fill holes 22, 24 as well as deposit the plural turn loop patterns of antenna portions 30A, 30B and antenna 30. After one surface of the substrate or the sheet of substrates is printed with its pattern (or geometric pattern) of conductive adhesive, the substrate or sheet is heated to dry, B-stage or cure the conductive adhesive before the other surface thereof is printed with a related pattern (or geometric pattern) of the same conductive adhesive. The printed conductive adhesive patterns on the two surfaces of the substrate or sheet are electrically connected by the conductive adhesive filling holes 22, 24, and provide suitable contact bumps or strips 52, 54 corresponding to the contacts of an electronic device 40 that provide the input and output (I/O) connections thereto. Electronic device 40 is attached to substrate 20 either while the conductive adhesive of contacts 52, 54 is wet or after it is dry or B-staged and heated to a melt-flow condition, as described above. Electrically-conductive adhesives types PSS8090, CB8130, PSS8150, ESS8450, ME8456, ME8550-SMT and ME8650 available from AI Technology are suitable for screening and/or stenciling to produce the described conductive patterns.

Alternatively, antenna portion 30A on one surface of the substrate 20 may be formed of a stamped or etched metal foil. A substrate 20 preferably of a sheet of a laminatable B-staged epoxy or other suitable laminatable structural adhesive substrate material, typically having a thickness of about 25–250 µm (about 1–10 mils) is provided, again preferably in a sheet of sufficient size to form an array of substrates 20. Preferably the sheet of substrate material is formed with a pattern of holes or vias 22, 24 therein, but holes 22, 24 may be cut with suitable conventional tools. The sheet of substrate 20 material is laminated with a sheet of a thin metal foil, for example, a thin metal foil of about 2.5–12.5 µm (about 0.1–0.5 mils) thickness, such as by heat-stamped transfer of a copper, aluminum or silver foil. Alternatively, a metal foil of about 25–125 µm (about 1–5 mils) thickness is laminated to the substrate 20 and is then patterned by photo-etching to form antenna 30, or antenna portion 30A using conventional photo-etching, with the ends thereof in place over and either partially or completely covering holes 22, 24. The material of substrate 20 is a material that is, when B-staged or cured, as the case may be, not adversely affected by such processing as the photo-etching and plating of the metal foil. At least the portion of the remaining metal foil at holes 22, 24 is spot plated or coated with a precious or other metal, such as silver, nickel, nickel-gold, nickel palladium, to preserve its conductivity and adhesion against degradation by oxidation, for example. An electrically-conductive ink adhesive is then printed on the second surface of the sheet of substrate material to form the pattern of antenna portion 30B, contacts 52, 54 and other conductive features thereon, as described above. Holes 22, 24 may be filled with the deposited conductive adhesive or the metal foil may be built up by plating metal thereon to fill or partially fill holes 22, 24 before the spot plating or coating of a precious or other metal thereon and deposition of the conductive adhesive, to complete a conductive connection from antenna 30, 30 A to the second surface of the sheet of substrates, as described above. Electronic device 40 is attached to substrate 20 either while the conductive adhesive of contacts 52, 54 is wet or after it is dry or B-staged and heated to a melt-flow condition, as described above. Insulating thermosetting epoxy adhesive types MB7100, CB7200-E, LESP7450, ESP7450 and ME7850 are suitable for the substrate 20 material, either directly in liquid or paste form or in the form of a laminatable B-staged sheet, and electrically-conductive adhesives types PSS8090, CB8130, PSS8150, ESS8450, ME8456, ME8550-SMT and ME8650 are suitable for screening and/or stenciling to produce the described conductive patterns, which adhesives are available from AI Technology.

Figure 6:
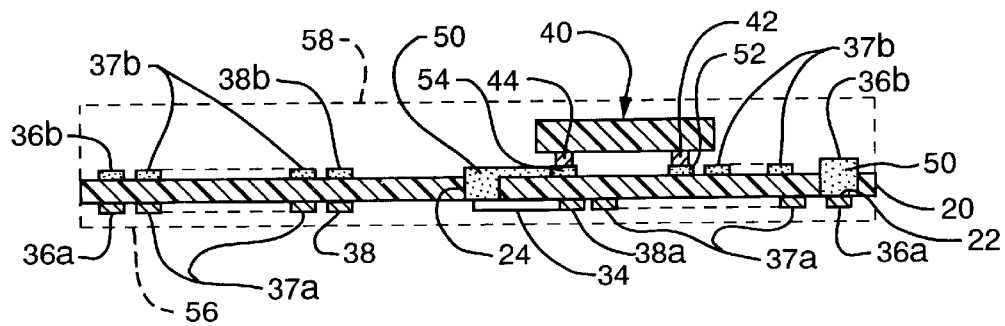
FIG. 6 is a sectional view schematic diagram of an article including the exemplary substrate of FIGS. 4 and 5 having an electronic device attached thereto.

Optionally, and for articles likely to encounter moisture and other potentially detrimental environments, an article according to the present invention may be covered with a layer of protective material. For example, as shown in FIG. 6, a layer 56 of an insulating adhesive may be applied to one surface of substrate to cover and protect antenna portion 30A and/or a layer 58 of an insulating adhesive may be applied to the other surface of substrate to cover and protect antenna portion 30B and electronic device 40. Layers 56, 58 may be applied by roll coating, screening, laminating or other suitable method, and may be covered by a layer of ABS, PVC, PET or other material, preferably a material similar to the material of substrate 20. Suitable insulating adhesives include, for example, insulating thermoplastic adhesives such as types MB7100, TP7090 and MB7100, and insulating thermosetting adhesives such as types CB-7200-E, MEE7650 and ESP7450-SC, all available from AI Technology.

Figure 7:
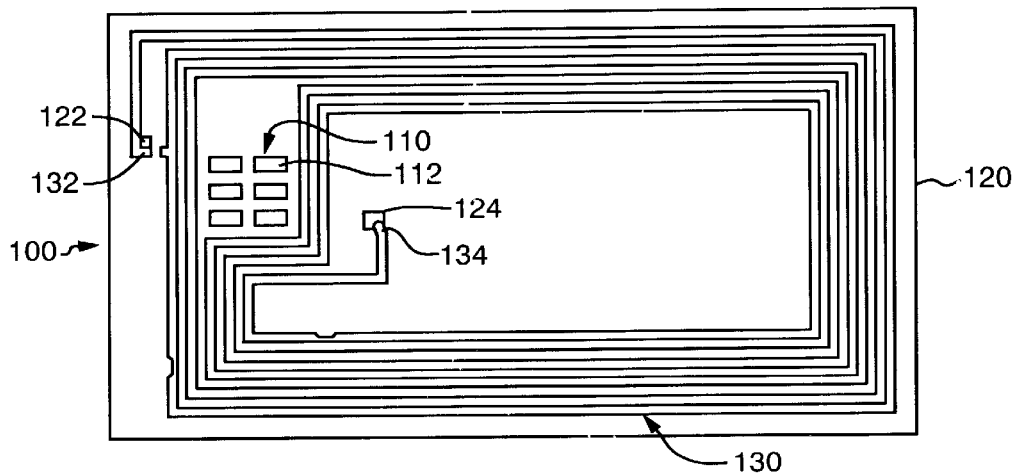
FIGS. 7 and 8 are plan view schematic diagrams of opposing surfaces of an alternative exemplary embodiment of an article according to the present invention.
Figure 8:
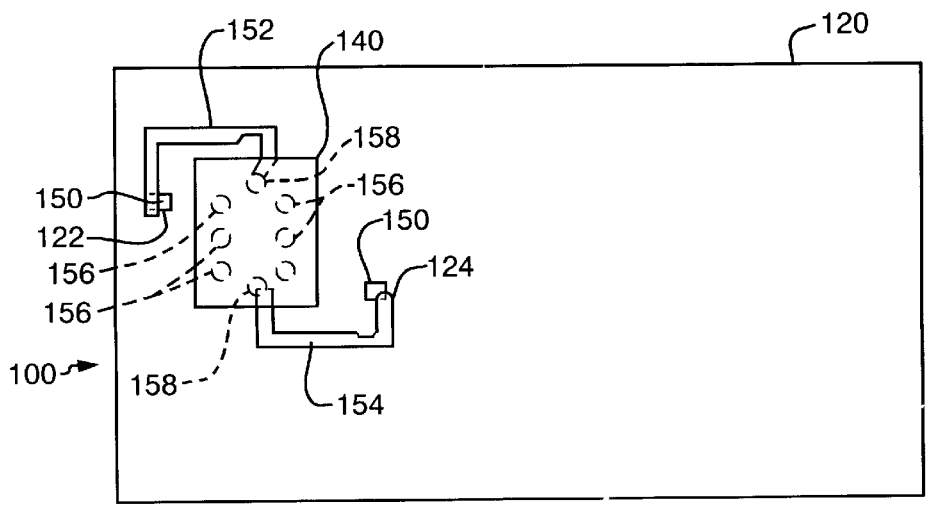

FIGS. 7 and 8 are plan views of opposing surfaces of an alternative exemplary embodiment of a wireless article 100 according to the present invention that includes, in addition to a plural turn antenna 130 for wireless communication with an external card reader by electromagnetic waves, a pattern 110 of contacts 112 located in a predetermined location on substrate 120 for making physical electrical connection to the contacts of an external card reader. The pattern 110 of metal contacts 112 are formed on one surface of substrate 120 which may be of any of the aforementioned substrate materials, but which is preferably a sheet of insulating adhesive such as type MB7100 thermoplastic or type, CB7200-E, ESP7250 or ESP7450 thermosetting insulating epoxy adhesive available from AI Technology. Contacts 112 are preferably of hot stamped thin copper, aluminum or silver foil, or of laminated copper applied to substrate 120 and photo-etched into pattern 110, and plated with one or more layers of protective metal, such as nickel and gold layers or nickel and palladium layers, all as described above. Substrate 120 has at least two holes 122, 124 therethrough at which are located the ends or terminals 132, 134 of plural-turn antenna 130 formed on the same surface of substrate as is pattern 110 of contacts 112, and has an additional hole (not visible in FIG. 7) located beneath each of contacts 112 for making electrical connection thereto. Preferably, plural-turn antenna 130 is located towards the edges of substrate to the extent practicable in view of the required predetermined position of contact pattern 110. Antenna 130 may be formed of hot stamped thin metal foil or of photo-etched metal in like manner to contacts 112 or may be deposited electrically conductive material, such as plated copper, aluminum or silver metal or an electrically-conductive adhesive, for example, types CB8130 PSS8090, PSS8150, ME8456, ME8550-SMT and ME8650 adhesives available from AI Technology, all as described above.

A pattern of conductors 152, 154, 156, 158 is formed on the other surface of substrate 120 by hot-stamping a copper, aluminum, silver or other metal foil thereon or depositing a pattern of electrically conductive material, such as copper, aluminum, silver, gold, and/or an electrically-conductive adhesive, for example, types CB8130 PSS8090, PSS8150, ME8456, ME8550-SMT and ME8650 adhesives available from AI Technology, all as described above. In depositing the electrically-conductive material onto substrate 120, electrically-conductive material fills holes 122, 124, which are typically about 75–250 $\mu$m (about 3–10 mils) in diameter, to form conductive connections or vias 150 to terminals 132, 134, respectively, of antenna 130 and fills the holes beneath contacts 112, which holes are typically about 250–1000 $\mu$m (about 10–40 mils) in diameter, to form conductive connections or vias thereto providing contacts 156. Conductor 152 provides electrical connection between terminal 132 of antenna 130 and one of the contacts 158 and conductor 154 provides electrical connection between terminal 134 of antenna 130 and the other of the contacts 158. One or more additional deposits of conductive material may be made in the locations of contacts 156, 158 to increase the height thereof for facilitating attachment of an electronic device 140 thereto. Where a thin metal foil, such as a hot-stamped silver, copper, aluminum or gold foil, is utilized, the thickness of the conductor provided thereby may be increased by plating conductive metal thereon, such a electroless silver, silver, nickel-gold, copper and the like, to decrease the electrical resistance of the conductor, as may be important for proper antenna performance.

Electronic device 140 has a pattern of contacts and is attached to the other surface of substrate 120 with its pattern of contacts facing the surface of substrate 120 and adhering thereto by a plurality of electrically conductive adhesive connections to the corresponding contacts 156, 158 on substrate 120, i.e. in a flip-chip mounting manner. Certain of the contacts of electronic device 140, i.e. those arranged in two parallel rows of three contacts each, are connected through vias 156 to the contacts 112 of article 100, which are likewise arranged in two parallel rows of three contacts each. Two other contacts of electronic device 140, i.e. those not in the 2-row by 3-contact arrangement, are connected by conductors 152, 154 to plural-turn antenna 130 thereof.

As a result, if article 100 is inserted into a contact-type card reader, communication between the card reader and electronic device 140 is via external contacts 112 of contact pattern 110, however, if article 100 is within communication range of a wireless-type card reader, communication between the card reader and electronic is via signals transmitted and/or received via plural-turn loop antenna 130.

The electronic devices referred to herein are conventional and may be obtained form plural commercial sources, including but not limited to Philips Electronics located in the Netherlands, Siemens and Infineon located in Germany, and Inside Technology located in France.

It is noted that the arrangements of articles described herein may be employed in any of the articles and may be made by the methods described in U.S. patent application Ser. No. 09/412,058 (AI-TECH-11) entitled "Article Having An Embedded Electronic Device, And Method Of Making Same" filed by Kevin Kwong-Tai Chung on Oct. 4, 1999, which application is hereby incorporated herein by reference in its entirety. For example, any of the articles of FIGS. 1–8 herein may be coated with a layer 56, 58 of insulating adhesive to cover and protect the antenna 30, 130 and the electronic device 40, 140 attached to substrate 20, 120, on either one or both sides of substrate 20, 120, and whether or not a card blank is or is not employed. Such wireless articles may be employed as an identification tag, an identification badge, a luggage tag, a pallet identification tag, a laundry tag, an access card, a credit card, a debit card, a cash card, a phone card, or like article.

In applications requiring high durability, such as laundering and industrial processes, the wireless article is preferably of flexible adhesive substrate, e.g., type ESP7450 flexible dielectric adhesive, on a polyester film, such as Mellinex polyester film available from E.I. duPont de Nemoirs located in Delaware. The electronic devices preferably connected to the substrate with a flexible electrically-conductive adhesive and a similar high-strength flexible dielectric underfill adhesive, e.g., types MEE7650 and MEE7660, respectively. The completed wireless tag is preferably laminated with a melt-bondable flexible adhesive that melts almost instantly and that withstands immersion in boiling water and other high-temperature and high-moisture conditions, so as to encapsulate and protect the substrate and electronic device. A preferred such adhesive is type ESP7450 flexible dielectric thermoplastic adhesive. The encapsulated wireless article is then hot-pressed into the cloth, clothing article or other object to be processed so that the melt-bondable adhesive permanently attached the wireless article to the object.

Figure 9:
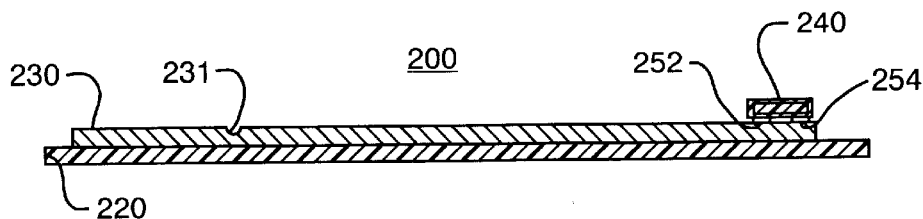
FIGS. 9 and 10 are side view schematic diagrams of exemplary articles according to the invention.

FIG. 9 is a side view of an exemplary article 200 according to the invention. Tamper-resistant wireless article 200 includes a substrate 220 that is an adhesive that also serves for attaching article 200 to the object to be identified. Suitable adhesives include thermoplastic adhesive that may be bonded to the object by either heat or a solvent or thermosetting adhesive that is attached to the object and cured, such as by application of heat. Suitable strong dielectric adhesives for tamper-resistant articles include, for example, type MB7100 thermoplastic dielectric adhesive, type CB7200-E thermosetting dielectric adhesive, and type ESP7450 thermosetting flexible adhesive, all available from AI Technology, Inc. The adhesive may comprise the entire substrate 220 or may be an outer layer or layers of a laminated substrate 220. A "strong" adhesive will have a "peel strength" that is at least 1000 gm/inch of width (about 400 gm/cm of width), and preferably more than 2000 gm/inch (about 800 gm/cm) of width, measured by a conventional pull test.

Antenna 230 is, for example, an etched copper pattern, and is preferably passivated by a layer of precious metal, such as silver or gold, to resist oxidation, at least at the contacts thereof at connections 252, 254. The plated metal layer also desirably serves to increase the height of the contacts and to reduce the resistance of antenna 230. The shape and size of substrate 220 and antenna 230 are established to fit the desired physical size requirements, if any, for article 200 in conjunction with the number of turns or loops of antenna 230 for receiving sufficient electromagnetic flux for operability with electronic device 240.

Contacts on electronic device 240 are attached to antenna terminals on substrate 220 in a flip-chip manner by connections 252, 254, such as by a relatively weakly bonding flexible electrically-conductive adhesive, so as to easily separate (de-bond) if article 200 is tampered with. "Weakly bonding" adhesives have a bond strength that is less than about 1000 psi (about 70 kg/m$^2$) measured by a conventional shear strength test. Suitable conductive adhesives include type PSS8090 where device 240 is not encapsulated and type CB8130 where device is covered or encapsulated, such as by type MB7100 thermoplastic adhesive. Preferably, the contacts of device 240 and the antenna 230 terminals are passivated by a precious metal, such as gold on nickel ("nickel-gold"), to resist oxidation.

Article 200 may be made to "tamper destruct" rather than to be just tamper resistant as follows. Antenna 230 is a heat stamped transfer of a thin foil of copper or aluminum or silver foil, and may retain the weakened feature about 25 μm (about 1 mil) in size. Typically, very thin metal foil, e.g., 2.5 to 12.5 μm (about 0.1 to 0.5 mil) thick is employed, and is plated with electroless silver, gold, palladium or platinum, or a combination thereof, typically to about the same thickness as is the hot-stamped metal foil, to reduce its resistance. A typical loop or turn of a hot stamped metal foil antenna 230 exhibits a resistance of about 10 to 100 ohms, which is reduced to less than 10 ohms, and typically to 0.2 to 2 ohms, by the plated precious metal layer so as to be effective with a typical electronic device 240, such as a "smart tag" type integrated circuit operating at a frequency of about 2.45 GHz available from Single Chip Systems Corporation located in California. An added benefit is that the metal plating also provides a desirable oxidation resistant coating for the antenna 230 and its terminals. Alternatively or additionally, antenna 230 may be an etched copper pattern having a thin portion 231, e.g., less than about 25 μm (about 1 mil) in thickness, so as to be fragile and not withstand an attempt to remove the substrate from the object to which it is attached.

Antenna 230 of a tamper-destruct article 200 may also be provided by depositing an electroless activatable thermoplastic such as ABS plastic on substrate 220. ABS plastic may be deposited, for example, by dissolving it in a solvent and printing, screening or stenciling it in the desired pattern of antenna 30 on substrate 220. The patterned ABS is plated with electroless silver or gold or combination of precious metals (plating will only adhere to the activatable ABS) to reduce the resistance to less than about 10 ohms, all as described above.

Electronic device 240 is connected to antenna 230 terminals by a relatively strong electrically-conductive adhesive, e.g., an adhesive having a strength in excess of about 1000 psi (about 70 kg/M$^2$), and preferably in excess of about 2000 psi (about 140 kg/M$^2$). A strong adhesive will tend to cause the thin antenna 230 to be pulled away from substrate 220 with device 240 and break. Suitable strongly bonding adhesives include, for example, AI Technology types ME8456, ME8550-SMT and ME8650 which may be encapsulated with type MEE7660 thermosetting dielectric adhesive for tamper resistant applications.

Typically, pressure sensitive (non-cured) adhesives have a peel strength of about 200–500 gm/inch of width, and are considered to relatively weakly bond. Cured adhesives typically have a peel strength of 1000 gm/inch of width and are considered to relatively strongly bond.

Figure 10:
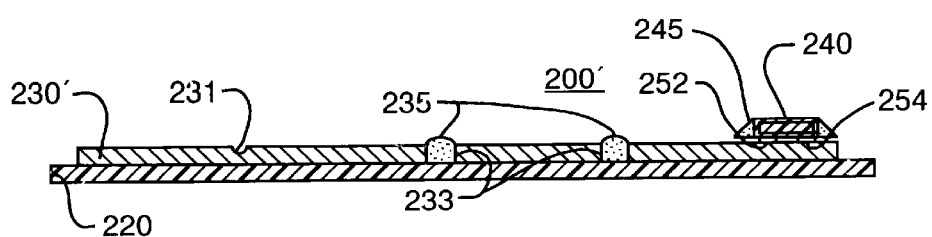

FIG. 10 is a side view of an exemplary article 200' according to the invention which is similar to article 200 of FIG. 9 described above. Article 200' differs from FIG. 9 in that antenna 230' has one or more small gaps 233 or discontinuities along its length that are filled or bridged by an electrically conductive adhesive 235 that strongly bonds to substrate 220 and will separate from the plated copper portions of antenna 230' so that antenna 230' is destroyed if article 200' is tampered with. Typically, the electrically-conductive gap-filling adhesive 235 utilizes the same type resin binders as the dielectric adhesive utilized for substrate 220. For example, type CB8130 electrically conductive adhesive is utilized with type MB7100 thermoplastic adhesive substrate and type CB8205-E electrically conductive adhesive is utilized with type CB7200-E thermosetting adhesive substrate. Antenna 230' may also include thin or narrow frangible portions 231. In addition, electronic device 240 is encapsulated to substrate 220 by an epoxy encapsulant 245, such as AI Technology type MEE7650 or MEE7660.

Figure 11A:
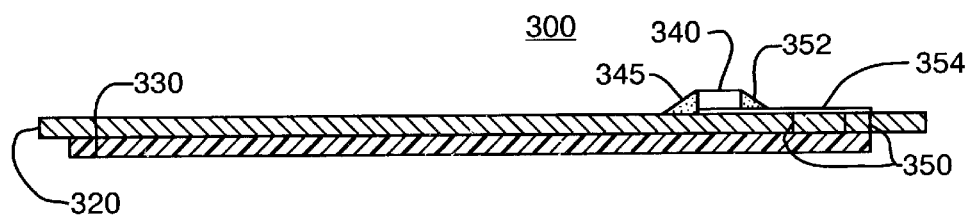
FIGS. 11A and 11B are side and plan view schematic diagrams, respectively, of another exemplary article according to the invention.
Figure 11B:
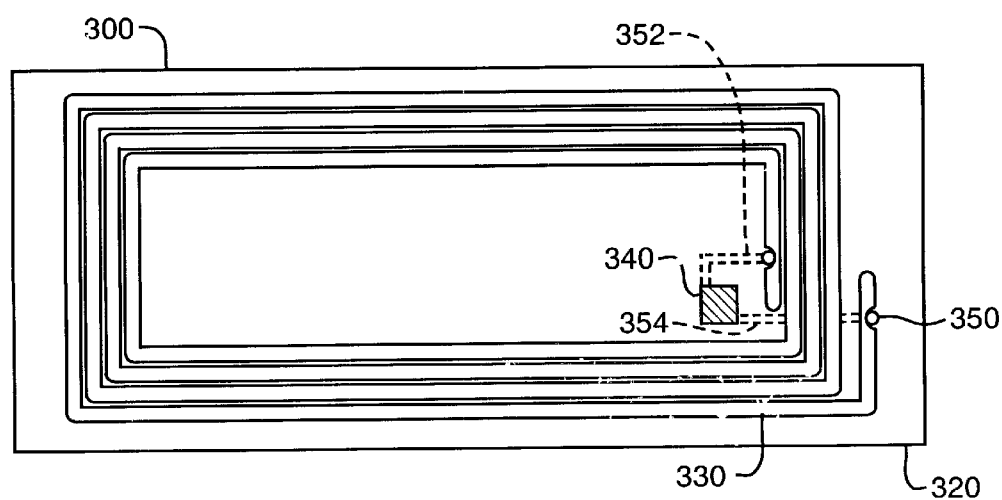

FIGS. 11A and 11B are side and plan views, respectively, of another exemplary article 300 according to the invention which differs from articles 200 and 200' in that electronic device 340 is on a surface of substrate 320 opposite antenna 330. Substrate 320 is like substrate 220 in structure and materials, except that electrically-conductive vias 350 are formed in holes 250 through substrate 320 to connect to the underside of antenna 330 and to connect to electronic device 340 by means of conductors 352, 354. Preferably, the holes in which conductive vias 350 are disposed are formed contemporaneously with substrate 320, such as by features on the mask, stencil or screen utilized in printing the dielectric adhesive forming substrate 320. Preferably, conductive vias 350 are of electrically-conductive adhesive deposited into the holes in substrate 320. Connections 352, 354 between conductive vias 350 and contacts of electronic device 340 are preferably also of electrically-conductive adhesive and are deposited contemporaneously with conductive vias 350 in a single screen printing, stenciling or mask printing operation. Suitable electrically-conductive adhesives include types PSS8090, CB8130 and PSS8150, and may be deposited, for example, in a width of 50–500 $\mu$m (about 2–20 mils) and at a thickness of 25–100 $\mu$m (about 1–4 mils).

Alternatively, connections 352, 354 may be of like structure and material as is antenna 330 which is like antenna 230 and/or 230' in structure and materials, e.g., is of etch-patterned copper, hot-stamped copper foil with electroless silver plating, hot-stamped silver foil or electroless silver plated on an activated plastic such as ABS plastic. Antenna 330 may be plated with silver, electroless silver, copper, aluminum and the like to increase its thickness and to decrease the resistance thereof, e.g., to less than five ohms, and typically to about two ohms. Conductors 352, 354 are preferably bonded to substrate 320 and at least partially encapsulated so as to be frangible and tend to break easily if article 300 is attempted to be removed from the object to which it is attached or is otherwise tampered with.

The embodiments of FIGS. 9–11B in particular lend themselves to inexpensive fabrication and to have tamper resistant and tamper destruct properties, as desired. Accordingly, such an electronic article is adapted for attachment to a utilization object (e.g., an object to which the electronic article is attached for identification, inventory, cleaning, laundering, processing or other purpose) and comprises a layer of electrically insulating adhesive providing a substrate adapted for adhering to a utilization object. The adhesive preferably has an adhesive bond strength to the utilization object that substantially exceeds the intrinsic shear strength of the adhesive, whereby attempting to remove the substrate from a utilization object results in damage to the substrate before separation of the substrate from a utilization object. Substantially exceeds or substantially less than generally refers to a difference of about a factor of two or more. The intrinsic strength or shear strength of a material, such as an adhesive, is a measure of the physical force necessary to damage or destroy the sheet of material, such as by it tearing, breaking or otherwise suffering a loss of physical integrity or function. An electronic device is either mounted to or embedded in the adhesive substrate and is electrically connected to an antenna on a surface of an adhesive layer of the adhesive substrate.

Typical adhesives having greater bond strength than intrinsic strength have a peel strength greater than about 1000 gm/inch of width and a shear strength greater than about 2000 psi (about 140 kg/cm$^2$), and preferably greater than about 1000 psi (about 70 kg/cm$^2$). Suitable adhesives include, for example, thermoplastic and thermoset adhesives types CB7130 and ESP7450.

At least a portion of the antenna is preferably a frangible region having a strength substantially less than the intrinsic strength of the adhesive of the substrate, whereby attempting to remove the electronic article from the utilization object by physical force tends to damage the antenna. The frangible region includes either a thin region, a narrowed region, a notch, a thin foil of copper, aluminum or silver, electroless plated silver on activated plastic, electroless plated silver on activated ABS, or electrically-conductive adhesive bridging a gap in the pattern of electrically-conductive material. Preferably, the frangible region has a thickness less than about 0.025 mm or a width less than about 0.10 mm. The antenna preferably includes alternatively either a patterned metal foil of copper, aluminum or silver, having a thickness of at least about 0.01 mm, and typically about 0.025 mm, and a width at least in part of at least about 0.10 mm, or a pattern of electroless plated silver on activated plastic or electroless plated silver on activated ABS, wherein the electroless silver has a thickness of less than about 0.025 mm, and typically about 0.01 mm, and a width at least in part of at least about 0.10 mm.

The electronic device is electrically connected to the antenna by electrically-conductive adhesive that is either (a) of substantially lower intrinsic strength than the intrinsic strength of the adhesive of said substrate, or (b) soluble in a solvent that dissolves the adhesive of said substrate, whereby attempting to remove the electronic article from a utilization object by physical force or solvent tends to damage the electrical connection of the antenna to the electronic device. Preferably and alternatively, the antenna includes a patterned metal foil of one of copper, aluminum and silver, and has electroless silver plating thereon for providing an antenna having a resistance of less than about 2 ohms.

Figure 12:
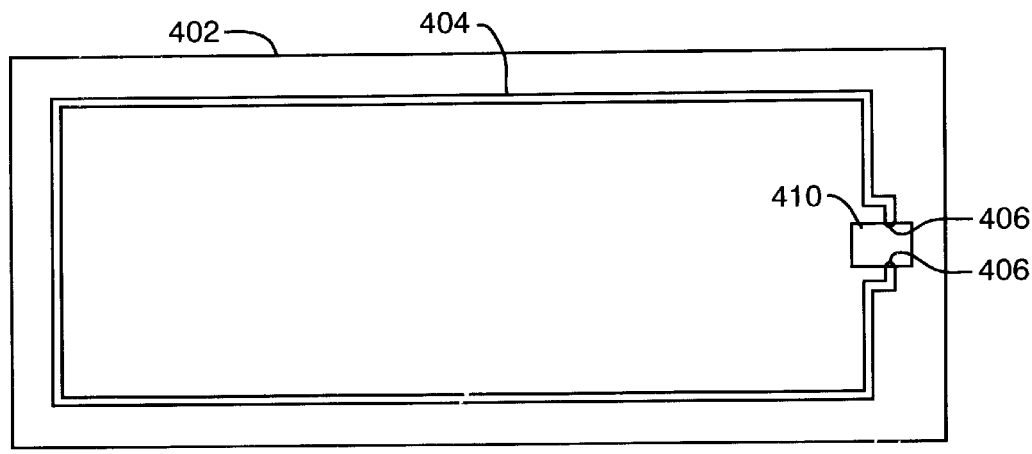
FIG. 12 is a plan view schematic diagram of an alternative exemplary embodiment of a contact-less card according to the present invention.
Figure 13:
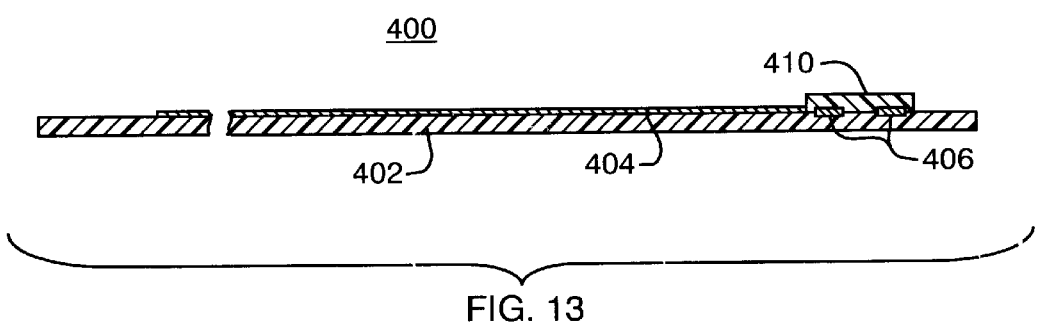
FIGS. 13 and 14 are cross-sectional side view schematic diagrams of the article of FIG. 12 and an alternative embodiment thereof.

FIGS. 12 and 13 are plan and side view schematic diagrams, respectively, of an exemplary substrate 402 for a contact-less card 400 having an electronic device therein. Substrate 402 is formed of a thin sheet of substrate material, such as thermoplastic or thermosetting dielectric adhesive, PVC, PET, ABS or HIPS, polyimide, polymer film, or other plastic, or paper film, or other suitable material, on which is deposited an elongated electrical conductor 404 that serves as an RF loop antenna 404. Antenna 404 is formed of a thermoplastic or thermosetting polymer adhesive that is made electrically conductive by the inclusion of electrically conductive particles therein, and which may include one or more regions of reduced width and/or thickness to provide frangible areas that break easily to provide tamper-destruct properties, or of a hot-stamped metal foil or the like. Electronic device 410 is attached to substrate 402 in a flip-chip manner by electrical connections 406 that bond the contact pads thereof to the ends of the elongated conductive pattern 404 of conductive adhesive that serve as the contacts of RF loop antenna 404. Connections 406 to electronic device 410 at the ends of conductive pattern 404 may be made while the conductive adhesive thereof is wet by placing electronic device 410 thereon or conductive adhesive pattern 404 may be dried or B-staged before electronic device 410 is placed to contact the ends thereof by melting or curing the conductive adhesive. As a result, and beneficially, the substrate is made in a single deposition rather than requiring the deposition of a thick-film ink to form the antenna conventionally and conductive bumps to form interconnections between the antenna and the electronic device.

A stencil, screen or mask defining the pattern of antenna 404 is employed to deposit electrically conductive adhesive on substrate 402 in the pattern of antenna 404. Typically, the substrate 402 is between about 0.025 mm and 1 mm thick (about 1–40 mils thick), and the conductors forming antenna 404 are about 250 $\mu$m (about 10 mils) wide and are within the range of about 25 $\mu$m to 125 $\mu$m thick (about 0.5 to 5 mils thick). In most cases, the conductors of antenna 404 are about 50–100 µm thick (about 2–4 mils thick) when wet and about 12.5–75 µm thick (about 0.5–3 mils thick) after drying or B-staging. Suitable conductive adhesives include, for example, type PSS8150 thermosetting conductive adhesive filled with silver particles which is available from AI Technology, Inc. and type CB025 silver-filled conductive ink available from E.I. duPont de Nemoirs located in Delaware. The deposited conductive adhesive is dried or B-staged by heating in an oven. Electronic devices 410 may be positioned to the substrate 402 either when the adhesive is still wet from being deposited or after the conductive adhesive is dried or B-staged.

Where antenna 402 has plural turns and electronic device 410 bridges one or more turns of antenna 404 or other conductors formed of electrically-conductive adhesive, and particularly where the width or spacing of such conductors is small, i.e. less than about 0.25–0.5 mm (about 10–20 mils), the deposited conductive adhesive is preferably dried or B-staged before attachment of electronic device 410. A second deposition of the same electrically-conductive adhesive is made to deposit a second layer of adhesive on bumps 406 to which electronic device 410 may be attached while the second layer of adhesive is wet or after drying or B-staging. However, where the conductor width or spacing is small, it is preferred that attachment of electronic device 410 be after the second deposition of conductive adhesive on bumps 406 has been dried or B-staged.

Optionally, but in certain applications, preferably, an insulating adhesive underfill in liquid form may be applied along the edges of electronic device 410 from where it flows by capillary action to substantially fill the remaining volume between electronic device 410 and substrate 402 that is not filled by conductive adhesive. Such adhesive underfill provides additional mechanical strength to the attachment of electronic device 410 to substrate 402 and resistance to moisture and other potential contaminants, as is desirable in a tamper-resistant article. Where the electrically-conductive adhesive is a flexible adhesive such as type PSS8150, as is desirable where the substrate 402 is somewhat flexible, a flexible adhesive underfill, such as type MEE7650 or type MEE7650-5 thermoplastic epoxy adhesive, is preferably utilized.

Figure 14:
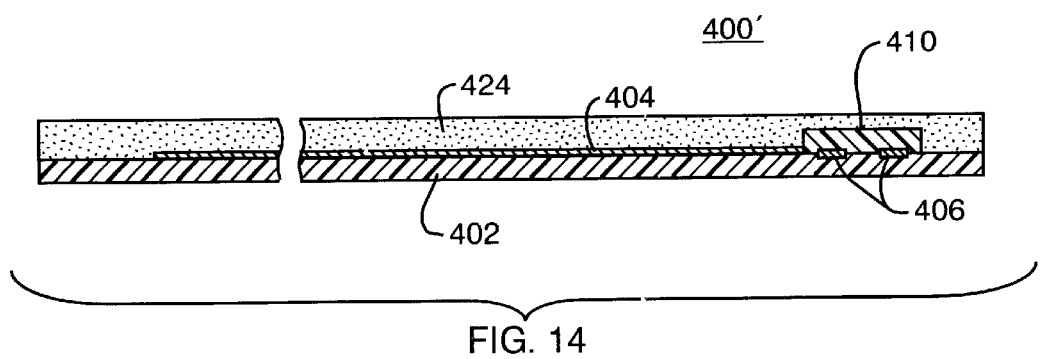

FIG. 14 is a cross-sectional side view of another alternative exemplary embodiment of a contact-less card 400' according to the present invention. Card 400', like card 400 described above, includes a prepared substrate 402 with loop antenna 404 and electronic device 410 mounted thereon as described in relation to FIGS. 12 and 13. Substrate 402 is encapsulated by roll coating a layer 424 or laminating a sheet 424 of melt-flowable adhesive thereto. Adhesive layer 424 has a thickness greater than the height (thickness) of electronic device 410 above substrate 402 so that it is sufficient to cover and encapsulate electronic device 410. It is noted that the adhesive of which layer 424 is formed is preferably selected to be of a different type than is the conductive adhesive of which loop antenna 402 and contacts 406 are formed so as to avoid the smearing thereof, such as an adhesive based upon a different chemistry of its molecular and physical structure, such as one being a thermosetting adhesive and the other being a thermoplastic adhesive or two adhesives employing different solvent so that the solvent of the one adhesive does not affect or dissolve the other adhesive. Smearing is also avoided if layer 424 is formed by laminating a sheet of dried or B-staged, i.e. solvent-free, adhesive to substrate 402. Substrate 402 may be attached or laminated to an object to be identified by placing them together between heated flat plates or heated rollers, at a temperature and for a time appropriate for adhesive layer 424 to melt flow and form a permanent bond between substrate 402 and the object, thereby to attach the complete contact-less card 400' with electronic device 410 positioned and encapsulated between substrate 402 and the object by melt-flowable adhesive 424.

Figure 15:
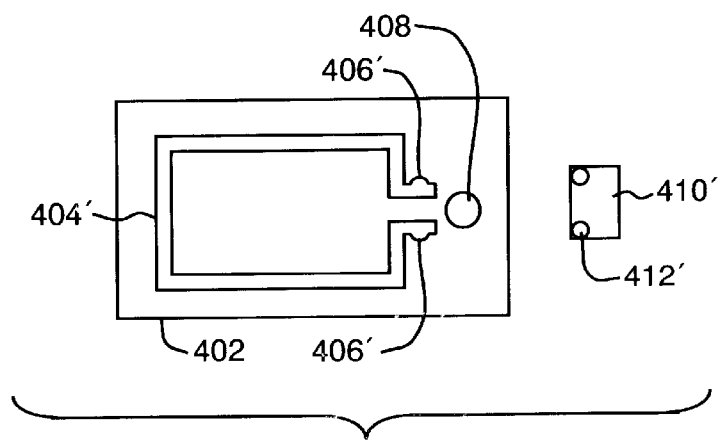
FIGS. 15 and 16 are plan view schematic diagrams of an alternative exemplary substrate for a contact-less card according to the present invention.

FIG. 15 is a plan view of a substrate 402 as for cards 400, 400' above in which an alternative arrangement for mounting an electronic device 410' to substrate 402 is employed. Electronic device 410', for example, a semiconductor die, which is illustrated apart from substrate 402, has two contact pads 412' located, for example, spaced apart along opposing edges thereof. RF loop antenna 404' of suitable width and conductivity is deposited, as by screen printing, stenciling or other suitable method of depositing an electrically-conductive adhesive, onto substrate 402 and has at the ends thereof contacts 406' of RF loop antenna 404' spaced apart the same distance as are contact pads 412' of electronic device 410' for making electrical connection thereto. In addition, a support 408 is deposited onto substrate 402 for supporting a part of electronic device 410' apart from contact pads 412' thereof. Support 408 may be deposited at the same time and of the same material as is antenna 404' if the surface of electronic device 410' to which it will be attached is passivated or coated so that the function of electronic device 410' will not be compromised by having electrically-conductive adhesive attached thereto, or support 408 may be deposited separately or of a different material, such as an electrically insulating adhesive. Alternatively, a second deposit of electrically-conductive adhesive may be made onto contacts 406' to increase the height thereof, and a second deposit of adhesive may be made onto support 408 to similarly increase the height thereof.

Figure 16:
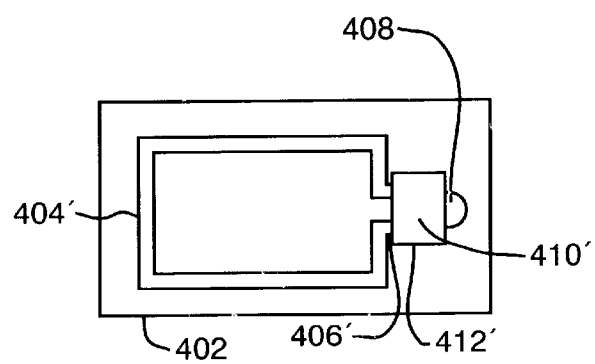

Electronic device 40' is flipped over and mounted to substrate 402, as is shown in FIG. 16, with contact pads 412' connecting to antenna contacts 406' and with electronic device 410 also being supported by support 408. Electronic device 410' can be attached to substrate 402 while the adhesive deposited to form contacts 406' and support 408 are still wet, or the adhesives forming contacts 406' and support 408 may be dried or B-staged prior to attachment of electronic device 410' thereto. Where a thermoplastic adhesive is utilized for contacts 406' and support 408, electronic device 410' may be attached to substrate 402 by heating substrate 402 and/or electronic device 410' to an elevated temperature sufficient to melt flow the thermoplastic adhesive (i.e. make it wettable for bonding and curing) when substrate 402 and device 410' are pressed together. Where a thermosetting adhesive is utilized for contacts 406' and support 408, electronic device 410' may be attached to substrate 402 by pressing device 410' into the wet thermosetting adhesive or by heating substrate 402 and/or electronic device 410' to an elevated temperature sufficient to melt flow the B-staged thermosetting adhesive (i.e. make it wettable for bonding and curing) and pressing substrate 402 and device 410' together. The thermosetting adhesive may then be cured by heating for a sufficient time at an appropriate elevated temperature.

The preferred adhesive for card 400, 400' is a type PSS8150 electrically-conductive, flexible thermosetting adhesive also available from AI Technology, which may be printed with a suitable width and thickness, e.g., about 1 mm wide and 0.1 mm thick, to provide suitable conductivity and quality factor Q of antenna 404'. An underfill may be employed to better secure electronic device 410' to substrate 402 after it is attached thereto by contacts 406' and support 408'. Where electronic device 410' is of small size, e.g., less than about 5 mm along its edge, an underfill of rigid material or of flexible material may be employed, with a flexible underfill material being employed where substrate 402 is flexible. If device 410' is larger, however, than about 5 mm along any edge and a rigid substrate such as an FR4 substrate is employed, or if substrate 402 is flexible, or if the adhesive employed for contacts 406' and/or support 408 is a flexible adhesive, then a flexible adhesive underfill is preferred. The underfill adhesive provides additional strength for the bond between device 410' and substrate 402, and also provides additional insulation and resistance to intrusion of contaminants, including migration of silver from the conductive particles that might be employed to impart conductivity to an electrically-conductive adhesive. The preferred adhesive for flexible underfill is a type MEE7650-5 electrically-insulating, flexible thermosetting adhesive also available from AI Technology, which may be applied along the edges of electronic device 410' and is drawn between device 410' and substrate 402 by capillary action. In addition, the same flexible insulating adhesive material may be employed as a protective coating for substrate 402 and card 400, 400' to resist mechanical abrasion of RF loop antenna 404' and contact of contaminants and other environments therewith. Because the size of the electronic devices usually utilized in these types of cards, rigid adhesive underfill may be utilized if additional mechanical protection is desired.

The method of making an exemplary card 400' is as follows. A 7-mil thick (0.178 mm) sheet of annealed, highly-printable PVC is obtained. Preferably, the sheet is of sufficient size that a plurality of substrates 402 may be made contemporaneously. For example, an 11-inch by 11-inch (about 28 mm by 28 mm) sheet is convenient for making a panel containing a 3 by 4 array of 12 substrates, or an 11-inch by 18-inch (about 28 mm by 46 mm) sheet is convenient for making a panel containing a 3 by 8 array of 24 substrates, each with sufficient unused peripheral area of the sheet remaining for the placement of guide holes or other indexing and alignment indicia that facilitate placement and alignment of the sheet, for example, with respect to screens and stencils, pick-and-place equipment, laminating equipment, die-cutting equipment, and the like. An electrically-conductive adhesive, such as type PSS8090 thermoplastic highly-electrically-conductive (e.g., <0.001 ohm-cm conductivity) adhesive available from AI Technology, is screen printed onto the PVC sheet at a thickness of about 2 mils (about 0.05 mm) to form the conductive loop antenna 404 and contacts 406 to which electronic devices 410 are to be attached in a single step, although stenciling, masking, ink-jet printing or other suitable deposition method could also be utilized. While the conductive adhesive is still wet, electronic devices 410 are placed onto the PVC sheet substrate in the proper positions for contacts thereon to make electrical contact and bond with the wet conductive adhesive at the ends of the 24 elongated patterns of conductive adhesive loop antenna by pick-and-place equipment. The substrates 402 with electronic devices 410 thereon are then dried or B-staged in an oven at about 60° C., and may be inspected and electrically tested, if desired. If the conductive adhesive is dried before placement of electronic device 410, substrate 402 and/or device 410 are/is heated to a temperature sufficient to melt-flow the conductive adhesive before device 410 is placed on substrate 402. A 10-mil thick (0.25 mm) sheet 424 of dried type MB7060-W melt-flowable white-pigmented adhesive is laminated to substrate 402 at a temperature of about 75° C. Preferably, this adhesive sheet 424 is of like size to that of which the plurality of substrates 402 are made, i.e. an 11-inch by 18-inch (about 28 mm by 46 mm) sheet for making a 3 by 8 array of 24 cards 400' with sufficient unused peripheral area of the sheet remaining for the placement of guide holes or other indexing and alignment indicia corresponding to those on the sheet of substrates 402 that facilitate placement and alignment of these two sheets. With proper indexing and sufficient precision of size, individual panels can be laminated to a web form for ease of subsequent die cutting and further processing. The sheet of substrates 402 and the sheet of adhesive 424 are roll laminated together at a temperature and speed selected to raise the adhesive 424 to about 65–75° C., which may be facilitated by pre-heating the two sheets to about 50–60° C. and also by employing heated pinch rollers spaced apart by a distance equal to the thickness of the finished card 400'. The pinch rollers also tend to eliminate trapping of air in pockets between the substrate and the adhesive, which would tend to weaken the card. The combined sheet of laminated cards 400' are then cut by a suitable rotary die cutter into individual cards, e.g., 24 cards, 400' each having an electronic device 410 embedded therein.

In like manner, cards 400,400' of PET and other materials may be made by the foregoing method where PET sheets and suitable melt-flowable adhesives, such as types MB7100 from AI Technology, and temperatures consistent therewith, are employed therein. For example, for substrates of PET material, electronic devices 410 may be attached with conductive adhesives at a melt-flow temperature of either 120° C. or 200° C., such as types PSS8090 and PSS8150, respectively, as is convenient, because with the PET heated to about 120° C. and the electronic device heated to about 200° C., the adhesive will melt flow and bond instantly without heating the PET appreciably above 120° C. Lamination of the card thereafter requires a temperature in the range of about 60–120° C., and preferably about 80° C., depending on the particular melt-flowable adhesive employed, which does not disturb the connections attaching the electronic device embedded therein. If an optional adhesive underfill is desired between electronic device 410 and substrate 402, a flexible adhesive, such as types MEE7650, MEE7650-5 and MEE7850 thermosetting epoxy adhesives available from AI Technology, which cure at a temperature of less than about 80° C., is suitable. Where the size of the electronic device is small, conventional rigid adhesive underfill may be employed.

It is noted that the arrangement of FIG. 14 is particularly advantageous because no cavity is required to be machined or otherwise formed in the card blank to receive the electronic device therein. This not only saves time and reduces cost, but also simplifies processing, and in addition permits thin substrate 402 material, e.g., about 5 mils (about 0.127 mm) thick, to be employed with a relatively thicker adhesive layer 424, e.g., about 10–15 mils (about 0.25–0.38 mm) thick, to easily accommodate standard thickness electronic devices. Thus, the melt flowable adhesive layer, such as type MB7070 thermoplastic adhesive which flows at a low temperature of about 70–90° C., serves as the core of card 400' and flows around electronic device 410 to "form in place" the cavity therefor with precise size and location. As a result, there is no need for an underfill of insulating adhesive under electronic device 410, thereby avoiding additional processing.

Figure 17:
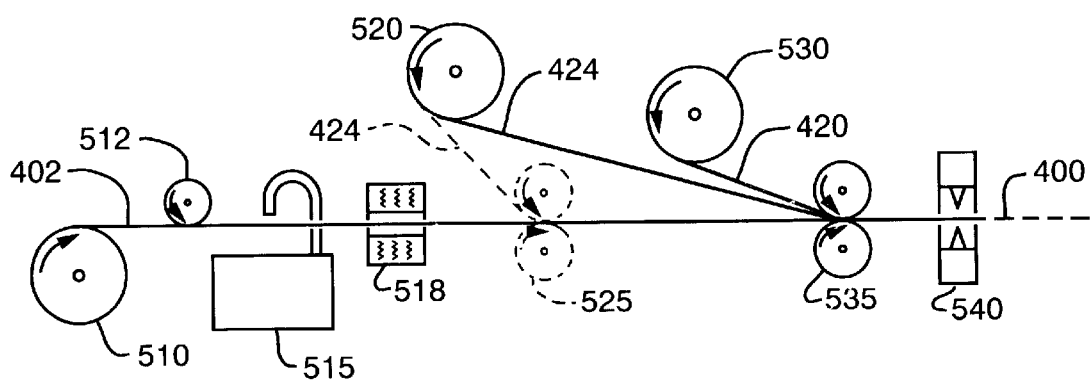
FIG. 17 is a schematic diagram of a manufacturing arrangement useful with the foregoing electronic substrates and cards.

In fact, the foregoing method advantageously lends itself to being employed in a continuous process to produce a large number of cards having an electronic device embedded therein. As shown in FIG. 17, instead of being provided in sheet form, the material from which substrates 402 are made is provided as a long strip in roll form, i.e. on roll 510, as is the melt-flowable adhesive on roll 520 to be laminated therewith. The conductive loops 404 and contacts 406 are roll printed onto the moving substrate strip 402 at printing station 512, the electronic devices 410 are placed thereon as substrate strip 402 moves past a pick-and-place equipment station 515, and the moving strip is dried as it passes through a drying oven station 518. Then the prepared substrate strip 402 and the melt-flowable adhesive strip 424 420 are brought together, preferably after pre-heating, and roll laminated in a set of pinch rollers 535 heated to a suitable elevated temperature and spaced apart a fixed distance that is the final card thickness, to form a strip of completed cards. Alternatively, panels having suitable sprocket holes may be butted together end-to-end and driven by a sprocket drive so as to be driven together with strips of adhesives. Finally the individual cards 400 are cut from the strip by a suitable rotary die cutter or other cutter 540.

Further, the arrangement of FIG. 17 may be employed with a roll 530 providing a strip 420 of release liner 420 which is interposed between adhesive 424 and pinch rollers 535 when substrate 402 is laminated with a strip of adhesive 424 by heated pinch rollers 535 so that adhesive 424 does not adhere to rollers 535.

Suitable pick-and-place equipment that is employed in the method described herein and in conventional surface mount technology is widely available commercially and typically has a placement inaccuracy of about 0.12 mm (about 5 mils) or less. Suitable pick-and-place equipment is commercially available from Mydata Automation located in Peabody, Mass., from Universal Instrument located in Binghamton, N.Y., from Zevatech Inc. located in Morrisville, N.C., and from Manncorp, and can place components onto substrates with a positional inaccuracy of one one-thousandth of an inch (about 25 $\mu$m) or less and at a rate greater than one component per second.

As is known, the contact pads on the substrates and those on the electronic devices are preferably passivated with an oxidation-resistant conductive material to further their making low resistance and reliable electrical connections. For example, copper contacts may be tinned with solder or plated, as are aluminum and other semiconductor contacts, or otherwise coated with layers of nickel, gold, nickel-gold, palladium, nickel-palladium, platinum or other precious metal, and combinations and alloys thereof.

Where electronic devices are attached or bonded to the article substrate by deposited bumps of an electrically conductive adhesive, preferred adhesives are thermoplastic and thermosetting adhesives that are "flexible" when cured, i.e. molecularly flexible. Molecularly flexible adhesives have a modulus of elasticity that is less than about 500,000 psi (about 35,000 kg/cm$^2$) over most of the range of temperatures that the bonded electronic device is specified to operate over. Suitable conductive adhesives include types PSS8090 and PSS8150 thermosetting paste adhesives which are melt-flow bondable at temperatures of about 120° C. and 200° C., respectively. Type PSS8090 may be melt-flow bonded at a lower temperature, such as 100° C., if a higher pressure is utilized, as is the case for type PSS8150 as well. If it is desired to employ an adhesive underfill between the electronic device and the substrate, an insulating adhesive that will be drawn under the electronic device when dispensed and having a modulus of elasticity no greater than that of the conductive adhesive utilized for the conductive electrical connections should be employed. For example, type MEE7650 flexible insulating thermosetting epoxy adhesive, which has a modulus of elasticity of about 10,000 psi (about 700 kg/cm$^2$), is suitable for use with types PSS8090 and PSS8150 conductive adhesives, as is type MEE7650-5 which is more flexible.

Attachment of wireless articles according to the invention to objects to be identified or tracked may be by a layer of adhesive or by an adhesive that is the substrate of the article. One suitable thermoplastic adhesive that melts and bonds instantly when pressed against PVC under a pressure of about 5 psi (about 0.35 kg/cm$^2$) at a temperature of 70° C. is type MB7060 adhesive which is available commercially in sheet form. Where the article is of PET which has a deformation temperature of about 120° C., an adhesive that bonds at a temperature below 120° C. is preferred. Suitable thermoplastic adhesives that melt and bond instantly when pressed against PET under a pressure of about 5 psi (about 0.35 kg/cm$^2$) include type MB7060 which bonds at a temperature of about 65–75° C., type MB7070 which bonds at a temperature of about 70–90° C., and type MB7100 which bonds at a temperature of about 110° C., all of which are commercially available in sheet form. Type MB7060 may be bonded at a lower temperature, such as 60° C. if a higher pressure is utilized, as is the case with types MB7070 and MB7100 as well. Further, where a high temperature and high-strength bond is desired, an epoxy adhesive, such as type ESP7450-SC thermosetting epoxy adhesive available from AI Technology, may be employed. Type ESP7450-SC has a high bond strength up to temperatures of about 125–150° C., yet is flowable (under a pressure of about 5 psi (about 0.35 kg/cm$^2$)) and curable in less than 30 minutes at a temperature of about 80° C. Each of these adhesives has a die-shear strength greater than 500–1000 psi (35–70 kg/cm$^2$) at temperatures below about 45° C., although a bond strength of about 200 psi (about 14 kg/cm$^2$) at temperatures below about 45° C. is sufficient for many applications. In addition, these adhesives are insensitive to exposure to moisture as is desirable for cards to be used in tropical climates, or to track items being laundered or otherwise processed.

The adhesives identified in the foregoing paragraphs are commercially available from AI Technology, Inc.

Where the substrate of a wireless article, card or tag includes sheet material, either as the substrate or as a layer in a substrate, such sheet material is typically formed of a suitable electronic substrate material, such as conventional printed wiring circuit board material (e.g., FR4 material), PVC, PET, acrylonitrile-butadiene-styrene (ABS), high-impact polystyrene (HIPS), polyimide, polyester, polyimide or other plastic material, and the like.

In addition to RF identification tag applications, cards and other articles according to the invention may be utilized in other applications and in special environments, such as remotely identifiable tagging devices used to keep track of, identify, and/or account for personnel, animals, tools, equipment, laundry, and other items, or as smart-card type credit cards and the like. For example, the articles described in U.S. patent application Ser. No. 09/411,849 entitled "Wireless Article Including a Plural-Turn Loop Antenna" and Ser. No. 09/412,058, entitled "Article having an Embedded Electronic Device, And Method For Making Same," both filed by Kevin K-T Chung on Oct. 4, 1999, each of which applications is hereby incorporated herein by reference it its entirety, may be employed.

In certain of these applications, the cards and the electronic devices therein may be exposed to a totally different environment that requires the substrate to be of a material other than those described above in relation to typical applications. For example, in the case of cleaning or laundry tags, the card and embedded device is washed and cleaned along with the clothing or other article to which it is attached and so is exposed to various chemical solvents, soaps, detergents and water, as well as to high temperatures of up to about 250° C. In such applications, the substrate and materials are selected to withstand the higher temperature and the chemical environment, and so may be polyimide film, such as Kapton® film, or other high temperature thermoplastics and thermoset materials. Further, to protect the electronic device, the attached semiconductor die may be encapsulated with a resin that exhibits satisfactory resistance to the expected chemicals and solvents to which the card will be exposed, such as type MEE7650. Different layering and thicknesses of adhesives may also be utilized. For example, types ESP7450-SC or TP7205-E pressure sensitive adhesives may be pre-applied as an outer layer of an article and may subsequently be utilized to bond the article onto the object that the article is to identify. The foregoing adhesives are also commercially available from AI Technology.

While the present invention has been described in terms of the foregoing exemplary embodiments, variations within the scope and spirit of the present invention as defined by the claims following will be apparent to those skilled in the art. For example, the loop antenna pattern and other features may be deposited by hot-stamping, screening, stenciling and/or masking as described, or other methods of application such as printing, ink-jet printing, preform lamination and the like may be used. Further, it is likewise suitable to employ flexible or rigid electrically-conductive adhesives and flexible or rigid insulating adhesives, in addition to the preferred conductive and insulating adhesives described herein.

While the exemplary embodiments herein are described in relation to one electronic device, plural electronic devices of like or differing kinds may be attached to a single substrate, e.g., in a flip-chip manner by either electrically-conductive adhesive or solder, or with conventional wire bonding. A single deposition of solder or conductive adhesive can provide contact bumps or strips for all the electronic devices as well as any interconnections therebetween.

By way of further example, the electronic devices may be single or plural semiconductor devices such as integrated circuits, memories, microprocessors and the like, and can include networks of conductors and/or diodes for providing continuity and the lack thereof between particular contacts, or networks of resistors and/or capacitors and/or inductors, as may be necessary or convenient in any particular application. Such devices are attached to substrates by solder or conductive adhesive connections, and suitable adhesive underfill materials may also be employed to fill the thin space between the electronic device and the substrate. Where the connections are formed by a flexible conductive adhesive, for example, a suitable underfill is a flexible insulating adhesive having a modulus of elasticity that is no greater than that of the flexible conductive adhesive. Adhesive underfill may be applied as a preform or by capillary action, screening, stenciling, masking, ink-jet printing or other suitable method. Where the electronic device is less than about 5 mm along any edge, conventional rigid adhesive underfill may be employed.

Further, contact-less cards as described herein may employ etched metal or wire conductive loops on the card substrate to serve as the RF antenna therefor. While not as advantageous as certain embodiments, wire loops may facilitate a multiple turn antenna having higher gain. A loop antenna having a small number of turns may be employed where the electronic device has spaced apart contacts that bridge over or straddle the intermediate turns of the antenna.

In any case, the antenna contacts to which the electronic devices electrically connect may be deposited onto the substrate or may be deposited onto the electronic devices, either at the individual semiconductor chip level or at the semiconductor wafer level, to make connect the loop antenna when the electronic device is attached to the substrate.

What is claimed is:

1. A tamper-resistant article comprising:
   a substrate having first and second opposing broad planar surfaces, said substrate including at least one layer of a strong dielectric adhesive on the first broad planar surface thereof having an exposed surface adapted for adhesively attaching said substrate to an object;
   a pattern of electrically-conductive material including an elongated electrical conductor on the first or the second broad planar surface of said substrate and having at least one electrical contact; and
   at least one electronic device attached to the first or the second broad planar surface of said substrate by a strong adhesive and having at least one contact electrically connected to the contact of said pattern of electrically-conductive material,
   whereby at least one of the at least one layer of strong dielectric adhesive of said substrate and the strong adhesive attaching said electronic device render said article resistant to tampering.

2. The tamper-resistant article of claim 1 wherein said elongated electrical conductor includes at least one of a deposited electrically-conductive adhesive and a metal foil.

3. The tamper-resistant article of claim 2 wherein said metal foil is laminated to the one surface of said substrate and is patterned to define said elongated electrical conductor.

4. The tamper-resistant article of claim 1 wherein at least one of said pattern of electrically conductive material and the electrical connection of the contact of said electronic device to said substrate includes at least one frangible region.

5. The tamper-resistant article of claim 4 wherein said frangible region includes at least one of a thin region, a narrowed region, a notch, a thin foil of copper or silver, electroless plated silver on activated plastic, and electrically-conductive adhesive bridging a gap in the pattern of electrically-conductive material.

6. The tamper-resistant article of claim 1 wherein said elongated electrical conductor includes a spiral conductor having at least one turn.

7. The tamper-resistant article of claim 1 wherein at least the at least one electrical contact of said pattern of electrically-conductive material is coated with an oxidation-resistant metal.

8. The tamper-resistant article of claim 1 wherein said pattern of electrically-conductive material is formed by one of (a) roll coating, screen printing, stenciling, mask printing, ink jet printing and laminating an electrically conductive adhesive, and (b) hot stamping and electroless plating a conductive metal.

9. The tamper-resistant article of claim 1 wherein the at least one contact of said electronic device is electrically connected to the contact of said pattern of electrically conductive adhesive by one of solder and an electrically-conductive adhesive.

10. The tamper-resistant article of claim 1 wherein the strong adhesive by which said electronic device is attached to said substrate includes at least one of a strong electrically-conductive adhesive connecting the contact of said electronic device to the contact of said pattern of electrically-conductive material and a strong dielectric adhesive underill.

11. The tamper-resistant article of claim 1 wherein the electronic device is attached to said substrate one of (a) while the electrically-conductive adhesive is wet, and (b) after the electrically-conductive adhesive is dried or B-staged and wherein one of said substrate and said electronic device is heated to melt flow said electrically-conductive adhesive.

12. The tamper-resistant article of claim 1 wherein said substrate further comprises a sheet of one of poly-vinyl-chloride (PVC), polyimide, poly-ethylene terephthallate (PET), FR4 material, acrylonitrile-butadiene-styrene (ABS), high-impact polystyrene (HIPS), polyimide, polybutylene terephthallate, polyester, polyester terephthallate, polymer blends, polyphynylene sulfide, polysulfone, polyether sulfone, paper film, dried insulating adhesive, B-staged insulating adhesive, and cured insulating adhesive.

13. The tamper-resistant article of claim 1 further comprising an insulating adhesive underfill attaching said electronic device to said substrate.

14. The tamper-resistant article of claim 1 wherein said at least one layer of strong dielectric adhesive of said substrate encapsulates said electronic device.

15. A tamper-resistant article comprising:
a substrate including at least one layer of a strong dielectric adhesive having an exposed surface adapted for attaching said substrate to an object and having at least two holes;
a pattern of electrically-conductive material including an elongated electrical conductor on one surface of said substrate and having at least one electrical contact; and
at least one electronic device attached to said substrate by a strong adhesive and having at least one contact electrically connected to the contact of said pattern of electrically-conductive adhesive,
whereby at least one of the strong dielectric material of said substrate and the strong adhesive attaching said electronic device render said article resistant to tampering, and
a second pattern of electrically-conductive material having at least two additional electrical contacts on a second surface of said substrate, each of said at least two additional contacts being electrically connected to said pattern of electrically-conductive material on the one surface of said substrate through the at least two holes, respectively, wherein said electronic device has at least two contacts electrically connected respectively to the at least two additional contacts of the electrically-conductive material.

16. The tamper-resistant article of claim 15 wherein said second pattern of electrically-conductive material includes electrically-conductive adhesive extending into the at least two holes of said substrate to provide electrical connection between the contacts of said electronic device and said pattern of electrically-conductive material on the one surface of said substrate.

17. A tamper-destruct article comprising:
a substrate having first and second opposing broad planar surfaces, said substrate including at least one layer of a dielectric adhesive on the first broad planar surface thereof having an exposed surface adapted for adhesively attaching said substrate to an object;
a pattern of electrically-conductive material including an elongated electrical conductor on the first or the second broad planar surface of said substrate and having at least one electrical contact; and
at least one electronic device attached to the first or the second broad planar surface of said substrate by an adhesive and having at least one contact electrically connected to the contact of said pattern of electrically-conductive material;
wherein at least one of said pattern of electrically conductive material and the electrical connection of the contact of said electronic device to said substrate includes at least one frangible region,
whereby tampering with said article tends to break at least one of the frangible regions of said pattern of electrically-conductive material and the adhesive attaching said electronic device.

18. The tamper-destruct article of claim 17 wherein said frangible region includes at least one of a thin region, a narrowed region, a notch, a thin foil of copper or silver, electroless plated silver on activated plastic, and electrically-conductive adhesive bridging a gap in the pattern of electrically-conductive material.

19. The tamper-destruct article of claim 17 wherein said elongated electrical conductor includes at least one of a deposited electrically-conductive adhesive and a metal foil.

20. The tamper-destruct article of claim 19 wherein said metal foil is laminated to the one surface of said substrate and is patterned to define said elongated electrical conductor.

21. The tamper-destruct article of claim 17 wherein said elongated electrical conductor includes a spiral conductor having at least one turn.

22. The tamper-destruct article of claim 17 wherein at least the at least one electrical contact of said pattern of electrically-conductive material is coated with an oxidation-resistant metal.

23. The tamper-destruct article of claim 17 wherein said pattern of electrically-conductive material is formed by one of (a) roll coating, screen printing, stenciling, mask printing, ink jet printing and laminating an electrically conductive adhesive, and (b) hot stamping and electroless plating a conductive metal.

24. The tamper-destruct article of claim 17 wherein the at least one contact of said electronic device is electrically connected to the contact of said pattern of electrically conductive adhesive by one of solder and an electrically-conductive adhesive.

25. The tamper-destruct article of claim 17 wherein the adhesive by which said electronic device is attached to said substrate includes at least one of a electrically-conductive adhesive connecting the contact of said electronic circuit to the contact of said pattern of electrically-conductive material and a dielectric adhesive underfill.

26. The tamper-destruct article of claim 17 wherein the electronic device is attached to said substrate one of (a) while the electrically-conductive adhesive is wet, and (b) after the electrically-conductive adhesive is dried or B-staged and wherein one of said substrate and said electronic device is heated to melt flow said electrically-conductive adhesive.

27. The tamper-destruct article of claim 17 wherein said substrate further comprises a sheet of one of poly-vinyl-chloride (PVC), polyimide, poly-ethylene terephthallate (PET), FR4 material, acrylonitrile-butadiene-styrene (ABS), high-impact polystyrene (HIPS), polyimide, polybutylene terephthallate, polyester, polyester terephthallate, polymer blends, polyphynylene sulfide, polysulfone, polyether sulfone, paper film, dried insulating adhesive, B-staged insulating adhesive, and cured insulating adhesive.

28. The tamper-destruct article of claim 17 further comprising an insulating adhesive underfill attaching said electronic device to said substrate.

29. The tamper-destruct article of claim 17 wherein said at least one layer of dielectric adhesive of said substrate encapsulates said electronic device.

30. A tamper-destruct article comprising:
- a substrate including at least one layer of a dielectric adhesive having an exposed surface adapted for adhesively attaching said substrate to an object and having at least two holes;
- a pattern of electrically-conductive material including an elongated electrical conductor on one surface of said substrate and having at least one electrical contact; and
- at least one electronic device attached to said substrate by an adhesive and having at least one contact electrically connected to the contact of said pattern of electrically-conductive material;
- wherein at least one of said pattern of electrically conductive material and the electrical connection of the contact of said electronic device to said substrate includes at least one frangible region,
- whereby tampering with said article tends to break at least one of the frangible regions of said pattern of electrically-conductive material and the adhesive attaching said electronic device, and
- a second pattern of electrically-conductive material having at least two additional electrical contacts on a second surface of said substrate, each of said at least two additional contacts being electrically connected to said pattern of electrically-conductive material on the one surface of said substrate through the at least two holes, respectively, wherein said electronic device has at least two contacts electrically connected respectively to the at least two additional contacts of the electrically-conductive material.

31. The tamper-destruct article of claim 30 wherein said second pattern of electrically-conductive material includes electrically-conductive adhesive extending into the at least two holes of said substrate to provide electrical connection between the contacts of said electronic device and said pattern of electrically-conductive material on the one surface of said substrate.

32. A wireless article having an electronic device embedded therein and adapted to evidence tampering therewith comprising:
- a substrate having first and second opposing broad planar surfaces;
- an electronic device mounted on the first broad planar surface of said substrate;
- a patterned electrically-conductive material on one of the first and second broad planar surfaces of said substrate electrically coupled to said electronic device, said patterned electrically-conductive material including a frangible region susceptible to breaking upon tampering therewith; and
- a layer of melt-flowable adhesive on the first broad planar surface of said substrate covering said electronic device, whereby said electronic device is encapsulated by said layer of melt-flowable adhesive, said layer of melt-flowable adhesive being adapted for adhesively attaching said substrate to a utilization object.

33. The wireless article of claim 32 wherein said frangible region includes at least one of a thin region, a narrowed region, a notch, a thin foil of copper or silver, electroless plated silver on activated plastic, and electrically-conductive adhesive bridging a gap in the pattern of electrically-conductive material.

34. The wireless article of claim 32 wherein said patterned electrically-conductive material is on the first surface of said substrate and includes an elongated electrical conductor having first and second ends electrically connected to said electronic device.

35. The wireless article of claim 34 wherein said elongated electrical conductor is a loop antenna of one of (a) a deposited pattern of conductive adhesive and (b) a hot-stamped foil of copper or silver on the first surface of said substrate.

36. The wireless article of claim 32 wherein said layer of melt-flowable adhesive is one of a laminated sheet and a deposited layer, wherein the deposited layer is deposited by one of roll coating, screen printing, stenciling, masking, and ink-jet printing.

37. The wireless article of claim 32 wherein said melt-flowable adhesive has a bond strength greater than about 200 psi (14 kg/cm$^2$) at temperatures less than about 45° C.

38. The wireless article of claim 32 wherein said substrate is of a material selected from the group consisting of polyvinyl chloride, acrylonitrile-butadiene-styrene polymer, high-impact polystyrene, polyester, and polyimide.

39. The wireless article of claim 32 further comprising a layer of adhesive on the second surface of said substrate adapted for attaching said wireless article to a utilization object.

40. A wireless article having an electronic device embedded therein and adapted to evidence tampering therewith comprising:
- a substrate having first and second opposing surfaces;
- an electronic device mounted on the first surface of said substrate;
- a patterned electrically-conductive material on said substrate electrically coupled to said electronic device, said patterned electrically-conductive material including a frangible region susceptible to breaking upon tampering therewith; and
- a layer of melt-flowable adhesive on the first surface of said substrate covering said electronic device, whereby said electronic device is encapsulated by said layer of melt-flowable adhesive, said layer of melt-flowable adhesive being adapted for attaching said substrate to a utilization object;
- wherein said patterned electrically-conductive material includes an elongated electrical conductor, and
- wherein said elongated electrical conductor is a loop antenna of one of (a) a deposited pattern of conductive adhesive and (b) a hot-stamped foil of copper or silver on the second surface of said substrate, and electrically connected to said electronic device by electrically-conductive adhesive vias through said substrate.

41. A wireless article having an electronic device embedded therein and adapted to evidence tampering therewith comprising:
- a substrate having first and second opposing surfaces;
- an electronic device mounted on the first surface of said substrate;
- a patterned electrically-conductive material on said substrate electrically coupled to said electronic device, said patterned electrically-conductive material including a frangible region susceptible to breaking upon tampering therewith; and a layer of melt-flowable adhesive on the second surface of said substrate, said layer of melt-flowable adhesive being adapted for attaching said substrate to a utilization object.

42. The wireless article of claim 41 wherein said frangible region includes at least one of a thin region, a narrowed region, a notch, a thin foil of copper or silver, electroless plated silver on activated plastic, and electrically-conductive adhesive bridging a gap in the pattern of electrically-conductive material.

43. The wireless article of claim 41 wherein said patterned electrically-conductive material is on the first surface of said substrate and includes an elongated electrical conductor having first and second ends electrically connected to said electronic device.

44. The wireless article of claim 43 wherein said elongated electrical conductor is a loop antenna of one of (a) a deposited pattern of conductive adhesive and (b) a hot-stamped foil of copper or silver on the first surface of said substrate.

45. The wireless article of claim 43 wherein said elongated electrical conductor is a loop antenna of one of (a) a deposited pattern of conductive adhesive and (b) a hot-stamped foil of copper or silver on the second surface of said substrate, and electrically connected to said electronic device by electrically-conductive adhesive vias through said substrate.

46. The wireless article of claim 41 wherein said layer of melt-flowable adhesive is one of a laminated sheet and a deposited layer, wherein the deposited layer is deposited by one of roll coating, screen printing, stenciling, masking, and ink-jet printing.

47. The wireless article of claim 41 wherein said melt-flowable adhesive has a bond strength greater than about 200 psi (14 kg/cm$^2$) at temperatures less than about 45° C.

48. The wireless article of claim 41 wherein said substrate is of a material selected from the group consisting of polyvinyl chloride, acrylonitrile-butadiene-styrene polymer, high-impact polystyrene, polyester, and polyimide.

49. The wireless article of claim 41 further comprising a layer of melt-flowable adhesive on the first surface of said substrate covering said electronic device and adapted for attaching said wireless article to a utilization object, whereby said electronic device is encapsulated by said layer of melt-flowable adhesive on the first surface of said substrate.

50. An electronic article comprising:

a layer of electrically insulating adhesive providing a planar adhesive substrate, the adhesive having an adhesive bond strength that substantially exceeds the intrinsic strength of the adhesive, whereby attempting to remove the planar adhesive substrate from an object to which it is adhesively attached by said adhesive results in damage to the planar adhesive substrate before separation of the planar adhesive substrate from the object;

an electronic device that is one of mounted to and embedded in said planar adhesive substrate; and an antenna on a surface of said planar adhesive substrate and electrically connected to said electronic device.

51. The electronic article of claim 50 wherein said antenna includes a patterned metal foil of one of copper, aluminum and silver, and electroless silver plating thereon for providing an antenna having a resistance of less than about 2 ohms.

52. An electronic article comprising:

a layer of electrically insulating adhesive providing a substrate, the adhesive having an adhesive bond strength that substantially exceeds the intrinsic strength of the adhesive, whereby attempting to remove the substrate from an object to which it is attached by said adhesive results in damage to the substrate before separation of the substrate from the object;

an electronic device that is one of mounted to and embedded in said adhesive substrate; and an antenna on a surface of said adhesive substrate and electrically connected to said electronic device, wherein said electronic device is electrically connected to said antenna by electrically-conductive adhesive that is one of (a) of substantially lower intrinsic strength than the intrinsic strength of the adhesive of said substrate, and (b) soluble in a solvent that dissolves the adhesive of said substrate, whereby attempting to remove the electronic article from a utilization object by physical force or solvent tends to damage the electrical connection of the antenna to the electronic device.

53. An electronic article comprising:

a layer of electrically insulating adhesive providing a substrate, the adhesive having an adhesive bond strength that substantially exceeds the intrinsic strength of the adhesive, whereby attempting to remove the substrate from an object to which it is attached by said adhesive results in damage to the substrate before separation of the substrate from the object;

an electronic device that is one of mounted to and embedded in said adhesive substrate; and an antenna on a surface of said adhesive substrate and electrically connected to said electronic device, wherein at least a portion of said antenna is a frangible region having a strength substantially less than the intrinsic strength of the adhesive of said substrate, whereby attempting to remove the electronic article from the object by physical force tends to damage the antenna.

54. The electronic article of claim 53 wherein said frangible region includes at least one of a thin region, a narrowed region, a notch, a thin foil of copper, aluminum or silver, electroless plated silver on activated plastic, electroless plated silver on activated ABS, and electrically-conductive adhesive bridging a gap in the pattern of electrically-conductive material.

55. The electronic article of claim 54 wherein at least said frangible region has at least one of a thickness less than about 0.025 mm and a width less than about 0.10 mm.

56. The electronic article of claim 53 wherein said antenna includes a patterned metal foil of copper, aluminum or silver, having a thickness of at least about 0.025 mm and wherein at least a part of said patterned metal foil has a width of at least about 0.10 mm.

57. The electronic article of claim 53 wherein said antenna includes a pattern of one of electroless plated silver on activated plastic and electroless plated silver on activated ABS, the electroless silver having a thickness of less than about 0.025 mm and a width at least in part of at least about 0.10 mm.

* * * * *